(12) United States Patent
Okubo

(10) Patent No.: US 11,844,180 B2
(45) Date of Patent: Dec. 12, 2023

(54) SEMICONDUCTOR STORAGE DEVICE

(71) Applicant: Kioxia Corporation, Tokyo (JP)

(72) Inventor: Rei Okubo, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 17/692,478

(22) Filed: Mar. 11, 2022

(65) Prior Publication Data

US 2022/0394862 A1 Dec. 8, 2022

(30) Foreign Application Priority Data

Jun. 2, 2021 (JP) ................................. 2021-093092

(51) Int. Cl.
*H05K 5/00* (2006.01)
*H05K 1/18* (2006.01)

(52) U.S. Cl.
CPC ........... *H05K 5/0026* (2013.01); *H05K 1/181* (2013.01); *H05K 2201/10159* (2013.01)

(58) Field of Classification Search
CPC ... H05K 1/02; H05K 1/11; H05K 1/14; H05K 1/18; H05K 1/181–187; H05K 5/00; H05K 7/00
USPC .... 361/736–759, 807–810; 439/76.1, 607.23
See application file for complete search history.

(56) References Cited

U.S. PATENT DOCUMENTS

| | | | |
|---|---|---|---|
| 7,833,056 B1* | 11/2010 | Lee ..................... | H01R 13/6581 439/946 |
| 8,149,583 B2* | 4/2012 | Ishii ...................... | H05K 3/368 361/752 |
| 8,665,601 B1* | 3/2014 | Mangay-Ayam, Jr. ..................... | H05K 9/0066 361/728 |
| 9,007,766 B2* | 4/2015 | Harvilchuck ........... | G06F 1/181 174/547 |
| 9,867,276 B2 | 1/2018 | Gwin et al. | |
| 2014/0168914 A1* | 6/2014 | Yokoyama .............. | H01L 25/16 361/749 |
| 2017/0220063 A1* | 8/2017 | Kumagai ............. | H05K 1/0204 |
| 2020/0060032 A1 | 2/2020 | Suzuki | |
| 2020/0305290 A1* | 9/2020 | Ohashi ..................... | H05K 5/03 |
| 2020/0371568 A1 | 11/2020 | Xiong et al. | |

FOREIGN PATENT DOCUMENTS

TW M562547 U 6/2018

* cited by examiner

*Primary Examiner* — Tuan T Dinh
(74) *Attorney, Agent, or Firm* — Oblon, McClelland, Maier & Neustadt, L.L.P.

(57) ABSTRACT

A semiconductor storage device according to an embodiment includes a housing and a board, a controller, and a semiconductor memory component. The housing includes a first wall portion, a second wall portion, a third wall portion, and a fourth wall portion. The first wall portion and the second wall portion are separatable from each other. The third wall portion and the fourth wall portion are separatable from each other.

20 Claims, 13 Drawing Sheets

SEMICONDUCTOR STORAGE DEVICE

CROSS-REFERENCE TO RELATED APPLICATION

This application is based upon and claims the benefit of priority from Japanese Patent Application No. 2021-093092, filed Jun. 2, 2021; the entire contents of which are incorporated herein by reference.

FIELD

Embodiments described herein relate generally to a semiconductor storage device.

BACKGROUND

A semiconductor storage device including a housing, a board accommodated in the housing, a controller mounted on the board, and a semiconductor memory component mounted on the board is known.

DETAILED DESCRIPTION

Figure 1:
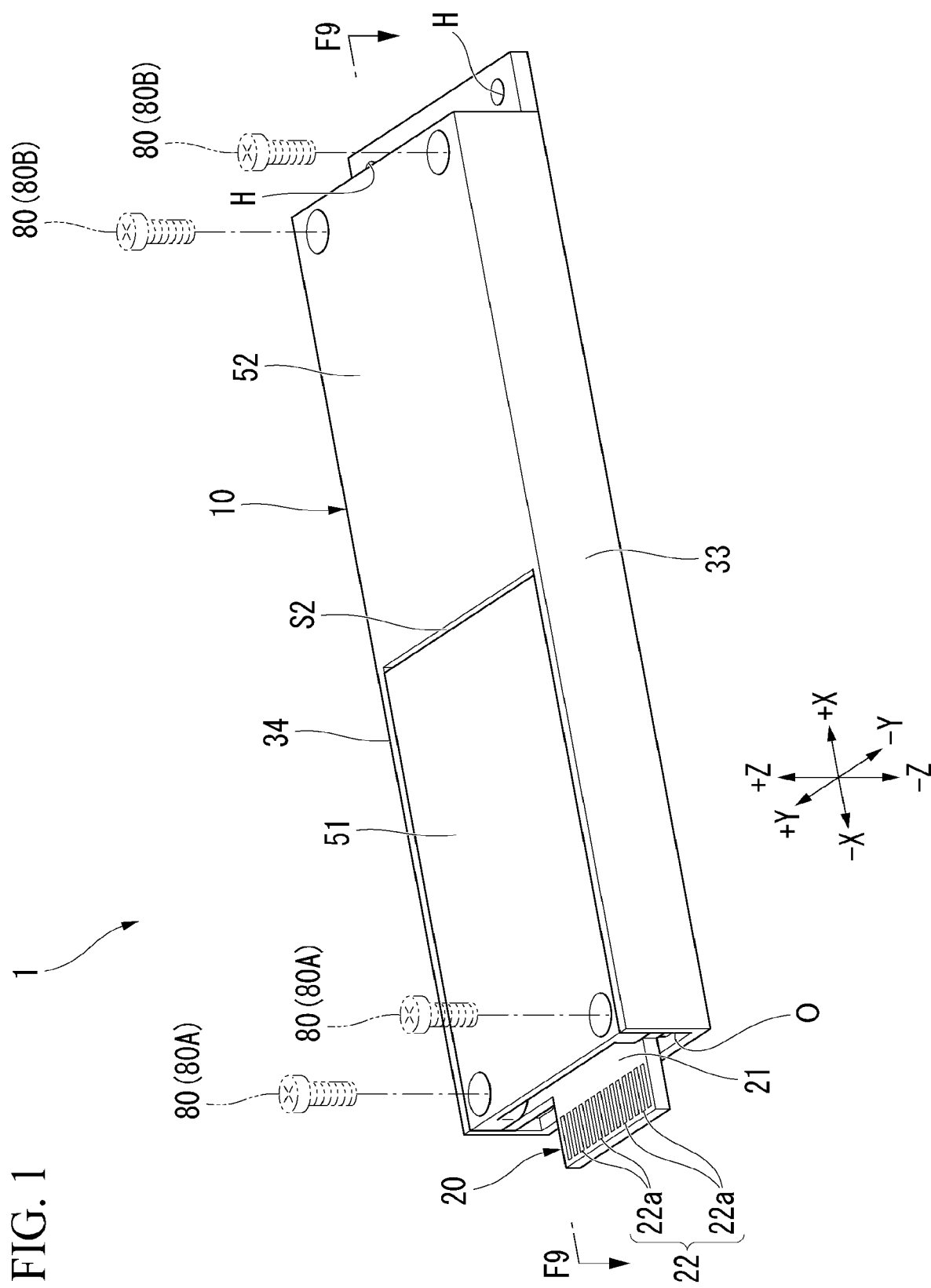
FIG. 1 is a perspective view showing a semiconductor storage device of a first embodiment.

A semiconductor storage device according to an embodiment includes a housing, a board, a controller, and a semiconductor memory component. The board is in the housing and includes a first region and a second region different from the first region. The controller is mounted in one of the first region and the second region. The semiconductor memory component is mounted in the other of the first region and the second region. The controller is configured to control the semiconductor memory component. The housing includes a first wall portion that is positioned on a first side with respect to the board in a first direction which is a thickness direction of the board, and faces the first region; a second wall portion that is positioned on the first side with respect to the board in the first direction and faces the second region; a third wall portion that is positioned on a second side which is a side opposite to the first side; with respect to the board in the first direction and faces the first region; and a fourth wall portion that is positioned on the second side with respect to the board in the first direction and faces the second region. The first wall portion and the second wall portion are separatable from each other. The third wall portion and the fourth wall portion are separatable from each other.

Hereinafter, a semiconductor storage device of embodiments will be described with reference to the drawings. In the following description, configurations having the same or similar functions will be designated by the same reference signs. Duplicate descriptions of such configurations may be omitted. In the present application, "parallel", "orthogonal", or "the same" each may include "substantially parallel", "substantially orthogonal", or "substantially the same", respectively. In the present application, "coupling" is not limited to mechanical coupling and may include electrical coupling. In addition, "coupling" is not limited to a case in which a plurality of constituents are directly coupled, and may include a case in which the plurality of constituents are coupled with other elements interposed therebetween.

First, a +X direction, a −X direction, a +Y direction, a −Y direction, a +Z direction, and a −Z direction will be defined here. The +X direction, the −X direction, the +Y direction, and the −Y direction are directions parallel to a first surface 21a (refer to FIG. 9) of a board 21 described later. The +X direction is a direction toward a second top wall portion 52 from a first top wall portion 51 of a housing 10 described later (refer to FIG. 1). The −X direction is a direction opposite to the +X direction. The +X direction and the −X direction will be simply referred to as an "X direction" unless otherwise distinguished. The +Y direction and the −Y direction are directions intersecting with (for example, orthogonal to) the X direction. The +Y direction is a direction toward a second side wall 34 from a first side wall 33 of the housing 10 described later (refer to FIG. 1). The −Y direction is a direction opposite to the +Y direction. The +Y direction and the −Y direction will be simply referred to as a "Y direction" unless otherwise distinguished.

The +Z direction and the −Z direction are directions intersecting with (for example, orthogonal to) the X direction and the Y direction, and correspond to a thickness direction of the board 21 described later. The +Z direction is a direction toward the first top wall portion 51 from a first bottom wall portion 41 of the housing 10 described later (refer to FIG. 9). The −Z direction is a direction opposite to the +Z direction. The +Z direction and the −Z direction will be simply referred to as a "Z direction" unless otherwise distinguished. In the present application, for convenience of description, the side in the +Z direction may be referred to as the "top", and the side in the −Z direction may be referred to as the "bottom". However, this does not limit a gravity direction. The +Z direction is an example of a "first direction". The +X direction is an example of a "second direction". The +Y direction is an example of a "third direction".

First Embodiment

<1. Overall Configuration of Semiconductor Storage Device>

A semiconductor storage device 1 of a first embodiment will be described with reference to FIGS. 1 to 11. For example, the semiconductor storage device 1 is a storage device such as a solid state drive (SSD). For example, the semiconductor storage device 1 is configured to be attached to an information processing apparatus such as a server or a personal computer and used as a storage of the information processing apparatus. In the present application, the information processing apparatus to which the semiconductor storage device 1 is configured to be attached will be referred to as a "host apparatus".

FIG. 1 is a perspective view showing the semiconductor storage device 1. For example, the semiconductor storage device 1 includes the housing 10, a board unit 20, and a plurality of fixing members 80. For convenience of description, the board unit 20 will be described first. Then, the housing 10 and the fixing members 80 will be described.

<2. Board Unit>

First, the board unit 20 will be described. As shown in FIG. 1, the board unit 20 is accommodated in the housing 10.

Figure 2:
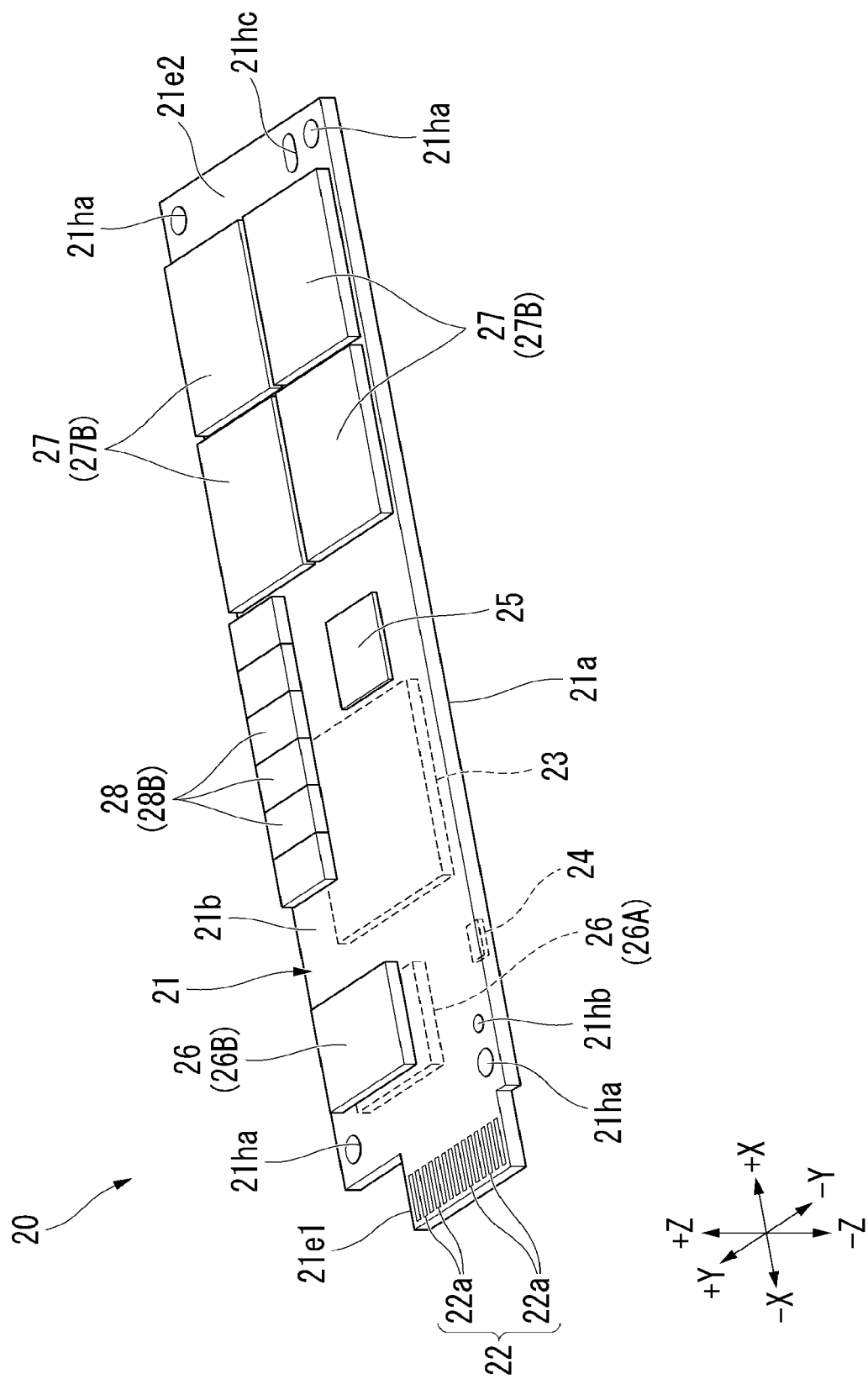
FIG. 2 is a perspective view showing a board unit of the first embodiment.

FIG. 2 is a perspective view showing the board unit 20. For example, the board unit 20 includes the board 21, a connector 22, a controller 23, a power conversion component 24, a power supply circuit component 25, a plurality of dynamic random access memories (DRAMs) 26, a plurality of semiconductor memory components 27, and a plurality of capacitors 28.

The board 21 has a plate shape along the X direction and the Y direction. For example, the board 21 has an elongated rectangular shape. The board 21 is a printed wiring board and includes an insulation base and a wiring pattern disposed in the insulation base. A plurality of insertion holes 21*ha* through which the fixing members 80 pass are disposed in four corner portions of the board 21. In addition, for example, one or more insertion holes 21*hb* into which a positioning pin 41*c* (refer to FIG. 6) is inserted, and one or more insertion holes 21*hc* into which a rotation preventing pin 42*c* (refer to FIG. 7) is inserted are disposed in the board 21.

The board 21 includes a first end portion 21*e*1 and a second end portion 21*e*2 positioned on a side opposite to the first end portion 21*e*1 in the X direction. The first end portion 21*e*1 is an end portion on the side in the −X direction. The first end portion 21*e*1 protrudes to the outside of the housing 10 through an opening O of the housing 10 (refer to FIG. 1). The board 21 includes the first surface 21*a* and a second surface 21*b* positioned on a side opposite to the first surface 21*a* in the Z direction. The first surface 21*a* is a surface facing in the −Z direction. The second surface 21*b* is a surface facing in the +Z direction.

Figure 3:
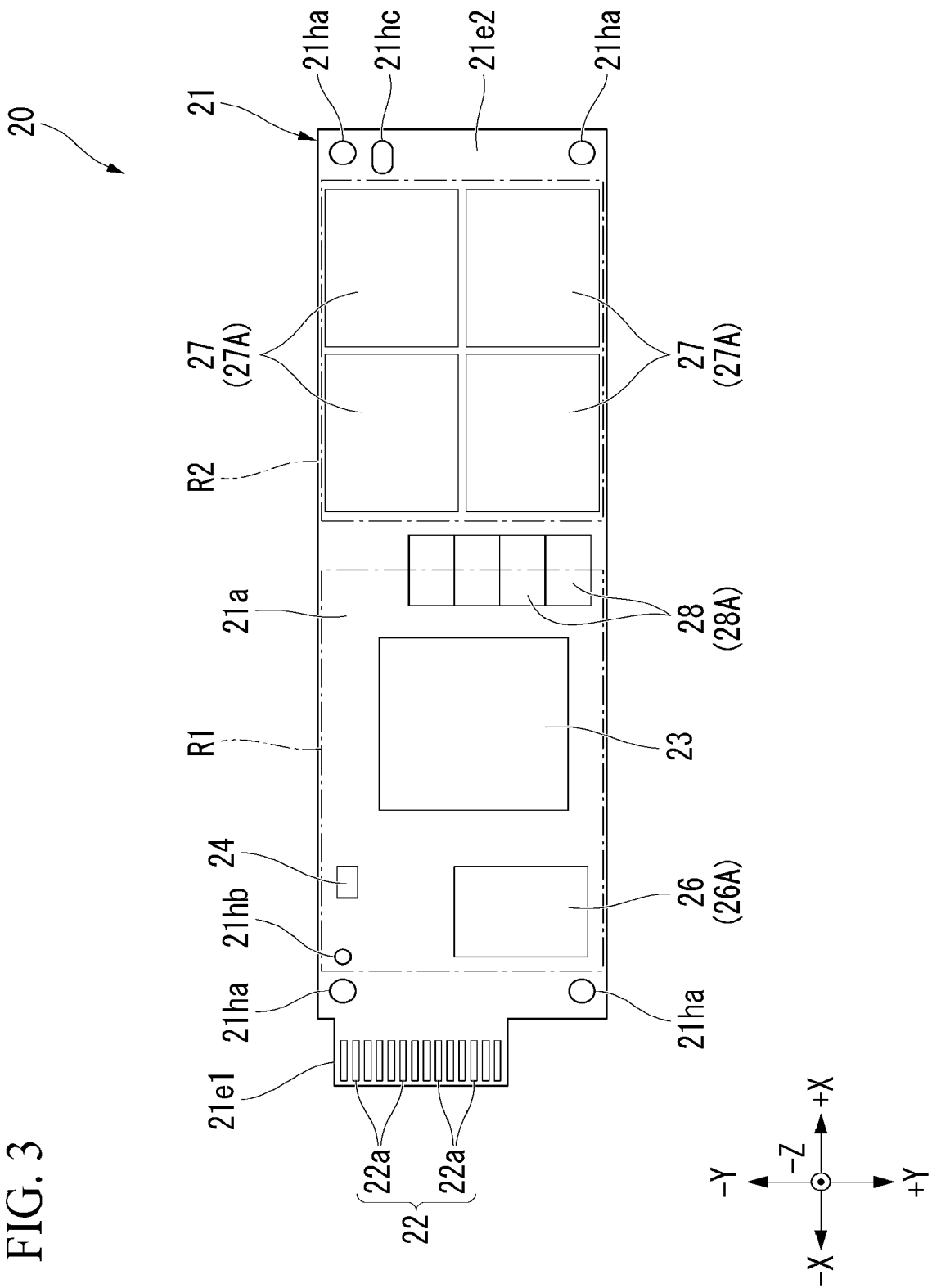
FIG. 3 is a bottom view showing the board unit of the first embodiment.
Figure 4:
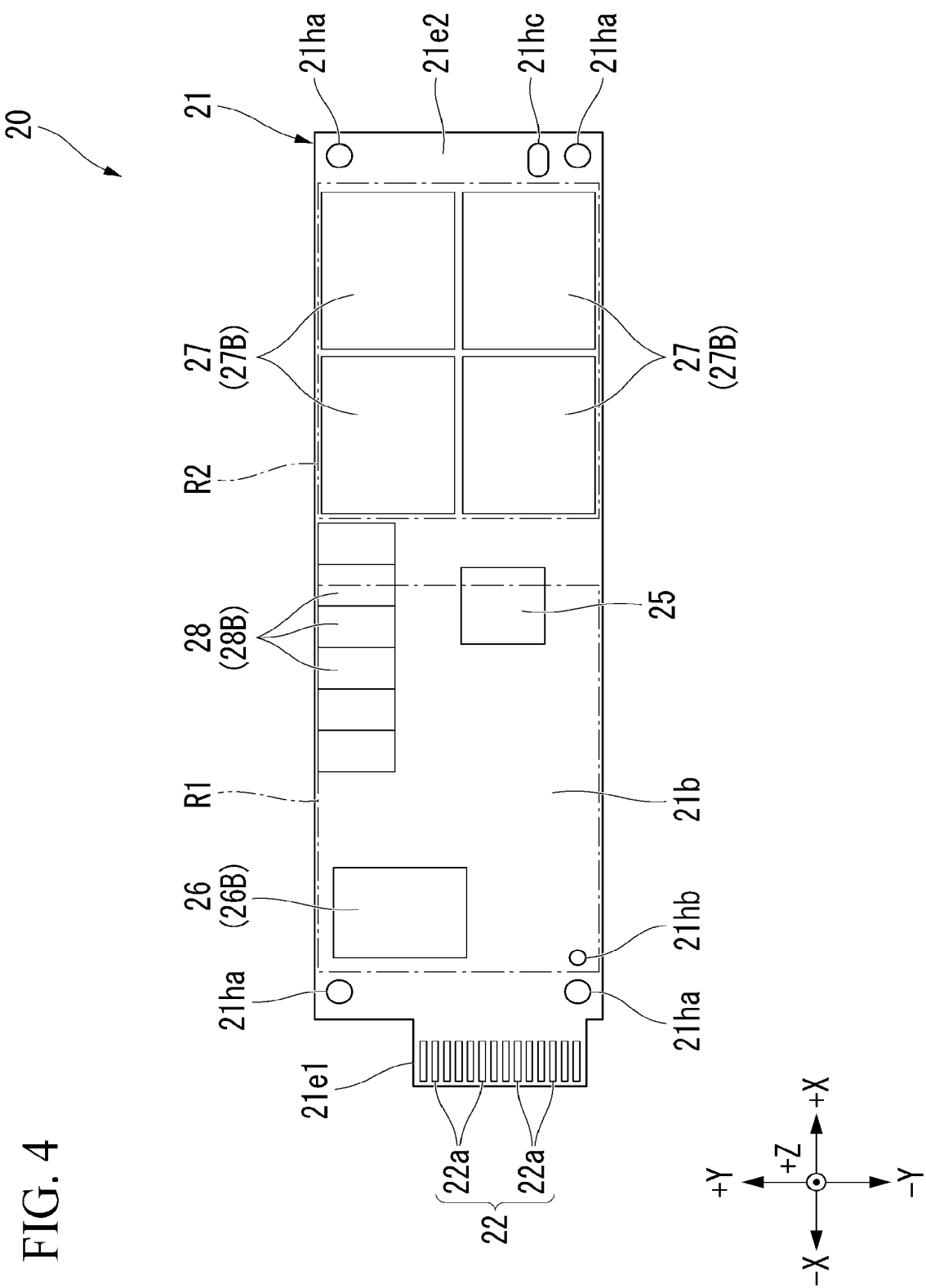
FIG. 4 is a top view showing the board unit of the first embodiment.

FIG. 3 is a bottom view showing the board unit 20. FIG. 4 is a top view showing the board unit 20. In the embodiment, the board 21 includes a first region R1 and a second region R2. In the present application, a "region of the board" is not limited to a region in a specific outer surface of the board 21, and may include a part of each of a plurality of outer surfaces (for example, a part of the first surface 21*a* and a part of the second surface 21*b*) of the board 21.

As shown in FIGS. 3 and 4, the first region R1 and second region R2 align in an order of the first region R1 and the second region R2 in the +X direction. That is, the first region R1 is positioned closer to the first end portion 21*e*1 of the board 21 than the second region R2 is in the X direction. The second region R2 is positioned closer to the second end portion 21*e*2 of the board 21 than the first region R1 is in the X direction.

The connector 22 is disposed in the first end portion 21*e*1 of the board 21 and is exposed to the outside of the housing 10 through the opening O. The connector 22 includes a plurality of metal terminals 22*a* aligning in the Y direction. The connector 22 can be coupled to a connector of the host apparatus.

The controller 23 is mounted in the first region R1 of the board 21. For example, the controller 23 is mounted on the first surface 21*a* of the board 21. The controller 23 is configured to generally control the entire semiconductor storage device 1. The controller 23 is a semiconductor package including a system-on-a-chip (SoC) in which, for example, a host interface circuit for the host apparatus, a control circuit that is configured to control the plurality of DRAMs 26, and a control circuit that is configured to control the plurality of semiconductor memory components 27 are integrated in one semiconductor chip. The controller 23 is a component that generates heat at a time of operation, and is an example of a "heat generation component". For example, the controller 23 has a higher temperature than the semiconductor memory components 27. In the present application, "mounting a certain component in a certain region" means mounting half or more of the component in the region and may include a case in which a part of the component protrudes from the region.

The power conversion component 24 is mounted in the first region R1 of the board 21. For example, the power conversion component 24 is mounted on the first surface 21*a* of the board 21. For example, the power conversion component 24 is a DC-DC converter. The power conversion component 24 is configured to convert power supplied from the host apparatus into power necessary for each component (the controller 23, the DRAMs 26, the semiconductor memory components 27, and the like) included in the board unit 20 and supply the converted power to each component. The power conversion component 24 is a component that generates heat at a time of operation, and is an example of the "heat generation component". For example, the power conversion component 24 has a higher temperature than the semiconductor memory components 27.

The power supply circuit component 25 is mounted in the first region R1 of the board 21. For example, the power supply circuit component 25 is mounted on the second surface 21*b* of the board 21. For example, the power supply circuit component 25 is a power management integrated chip (PMIC) and has a power management function. The power supply circuit component 25 is configured to perform a power control on each component (the controller 23, the DRAMs 26, the semiconductor memory components 27, and the like) included in the board unit 20. The power supply circuit component 25 is a component that generates heat at a time of operation, and is an example of the "heat generation component". For example, the power supply circuit component 25 has a higher temperature than the semiconductor memory components 27. The plurality of DRAMs 26 are mounted in the first region R1 of the board 21.

The plurality of DRAMs 26 include a first DRAM 26A and a second DRAM 26B. The first DRAM 26A is mounted on the first surface 21*a* of the board 21. The second DRAM 26B is mounted on the second surface 21*b* of the board 21. Each DRAM 26 is a semiconductor package including a volatile semiconductor memory chip. Each DRAM 26 may be used as a data buffer in which write target data received from the host apparatus, read target data read from one or more semiconductor memory components 27, and the like are temporarily stored. Note that the semiconductor storage device 1 may not include the DRAMs 26.

The plurality of semiconductor memory components 27 are mounted in the second region R2 of the board 21. The plurality of semiconductor memory components 27 include a plurality of first semiconductor memory components 27A and a plurality of second semiconductor memory components 27B. The plurality of first semiconductor memory components 27A are mounted on the first surface 21a of the board 21 and align in the X direction and the Y direction. The plurality of second semiconductor memory components 27B are mounted on the second surface 21b of the board 21 and align in the X direction and the Y direction. Each semiconductor memory component 27 is a semiconductor package including a non-volatile semiconductor memory chip. For example, each semiconductor memory component 27 is a NAND flash memory.

Note that the semiconductor memory components 27 are not limited to NAND flash memories and may be NOR memories, magnetoresistive random access memories (MRAMs), resistance-change memories, or other types of storage devices. That is, the "semiconductor memory components" are not limited to semiconductor memory components including a memory element that stores data based on a charge accumulation state, and may be semiconductor memory components including a memory element that stores data based on a magnetic state, a resistance state, and the like.

The plurality of capacitors 28 include a plurality of first capacitors 28A and a plurality of second capacitors 28B. The plurality of first capacitors 28A are mounted on the first surface 21a of the board 21. For example, the plurality of first capacitors 28A are arranged between the controller 23 and the plurality of first semiconductor memory components 27A. The plurality of second capacitors 28B are mounted on the second surface 21b of the board 21. For example, the plurality of second capacitors 28B are arranged between the second DRAM 26B and the plurality of second semiconductor memory components 27B. Each capacitor 28 has a power supply backup function for data protection at a time of unexpected power interruption. For example, when power supply from the host apparatus is unexpectedly interrupted, the plurality of capacitors 28 supply power to the controller 23, the plurality of DRAMs 26, and the plurality of semiconductor memory components 27 for a certain time period. For example, each capacitor 28 is an aluminum electrolytic capacitor. However, the capacitors 28 are not limited to the above example. The capacitors 28 are an example of an "electronic component".

<3. Housing>
<3.1 Overall Configuration of Housing>

Next, the housing 10 will be described.

Figure 5:
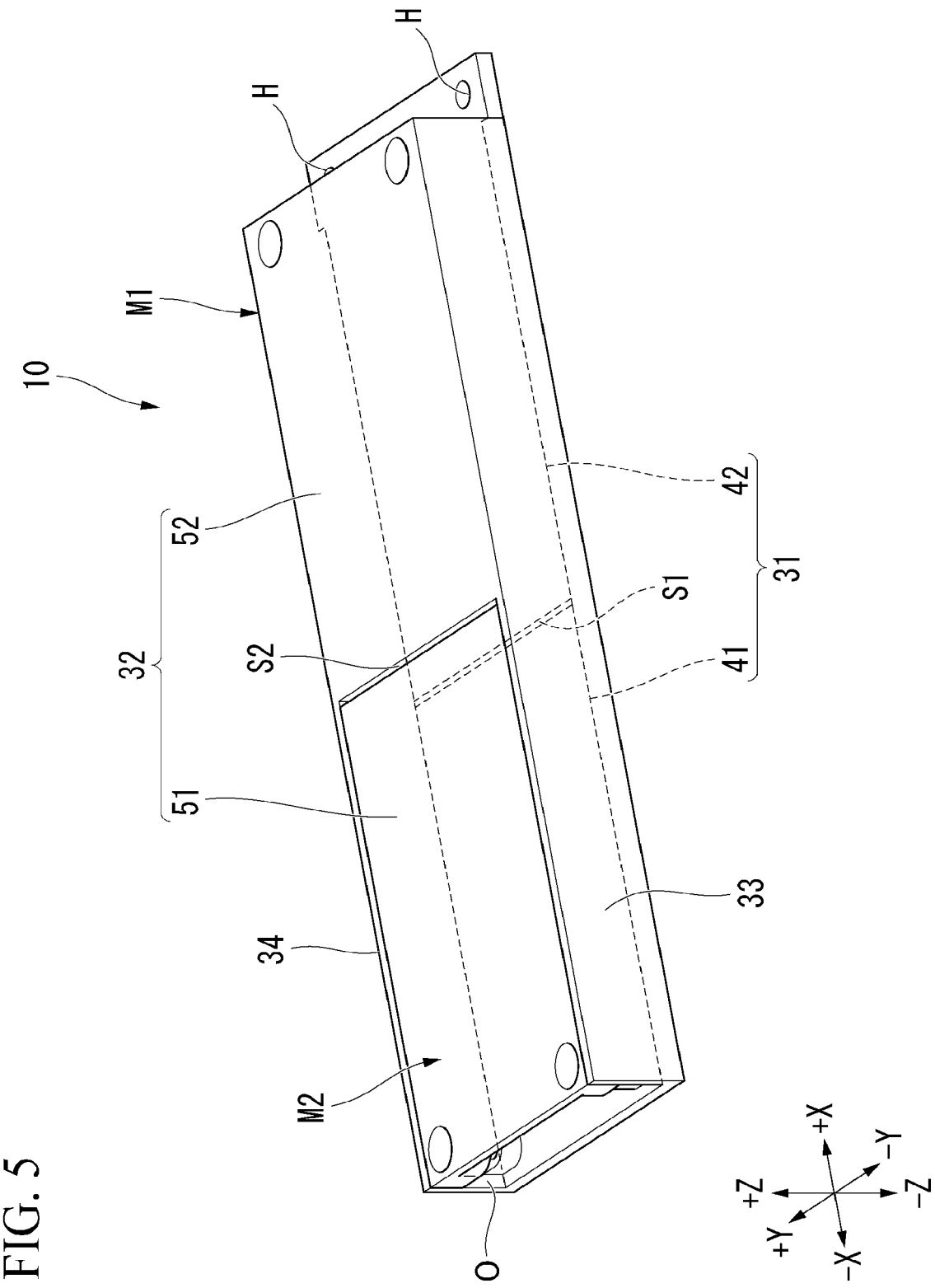
FIG. 5 is a perspective view showing a housing of the first embodiment.

FIG. 5 is a perspective view showing the housing 10. For example, the housing 10 includes a bottom wall 31, a top wall 32, the first side wall 33, and the second side wall 34.

The bottom wall 31 is positioned in an end portion of the housing 10 on the side in the −Z direction and is exposed to the outside of the housing 10. That is, the bottom wall 31 is positioned on the side in the −Z direction with respect to the board unit 20. The bottom wall 31 has a plate shape along the X direction and the Y direction. The bottom wall 31 includes the first bottom wall portion 41 and a second bottom wall portion 42. The first bottom wall portion 41 faces the first region R1 of the board 21 from the side in the −Z direction (refer to FIG. 9). The second bottom wall portion 42 is positioned on the side in the +X direction with respect to the first bottom wall portion 41. The second bottom wall portion 42 is arranged at the same position (same height) as the first bottom wall portion 41 in the Z direction. The second bottom wall portion 42 faces the second region R2 of the board 21 from the side in the −Z direction (refer to FIG. 9). Each of the first bottom wall portion 41 and the second bottom wall portion 42 has a plate shape along the X direction and the Y direction. The first bottom wall portion 41 and the second bottom wall portion 42 have the same thickness. The side in the −Z direction is an example of a "first side". The first bottom wall portion 41 is an example of a "first wall portion". The second bottom wall portion 42 is an example of a "second wall portion".

The top wall 32 is positioned in an end portion of the housing 10 on the side in the +Z direction and is exposed to the outside of the housing 10. That is, the top wall 32 is positioned on the side in the +Z direction with respect to the board unit 20. The top wall 32 has a plate shape along the X direction and the Y direction. The top wall 32 includes the first top wall portion 51 and the second top wall portion 52. The first top wall portion 51 faces the first region R1 of the board 21 from the side in the +Z direction (refer to FIG. 9). The second top wall portion 52 is positioned on the side in the +X direction with respect to the first top wall portion 51. The second top wall portion 52 is arranged at the same position (same height) as the first top wall portion 51 in the Z direction. The second top wall portion 52 faces the second region R2 of the board 21 from the side in the +Z direction (refer to FIG. 9). Each of the first top wall portion 51 and the second top wall portion 52 has a plate shape along the X direction and the Y direction. The first top wall portion 51 and the second top wall portion 52 have the same thickness. The side in the +Z direction is an example of a "second side". The first top wall portion 51 is an example of a "third wall portion". The second top wall portion 52 is an example of a "fourth wall portion".

The first side wall 33 is positioned in an end portion of the housing 10 on the side in the −Y direction and is exposed to the outside of the housing 10. That is, the first side wall 33 is positioned on the side in the −Y direction with respect to the board unit 20. The first side wall 33 has a plate shape along the X direction and the Z direction. The first side wall 33 extends between the bottom wall 31 and the top wall 32 in the Z direction. That is, the first side wall 33 covers a space between the bottom wall 31 and the top wall 32 from the side in the −Y direction. In the embodiment, the first side wall 33 extends across the entire length of the first top wall portion 51 and the entire length of the second top wall portion 52 in the X direction. The first side wall 33 is an example of each of "fifth wall portion" and "first coupling portion".

The second side wall 34 is positioned in an end portion of the housing 10 on the side in the +Y direction and is exposed to the outside of the housing 10. That is, the second side wall 34 is positioned on the side in the +Y direction with respect to the board unit 20. The second side wall 34 has a plate shape along the X direction and the Z direction. The second side wall 34 extends between the bottom wall 31 and the top wall 32 in the Z direction. That is, the second side wall 34 covers the space between the bottom wall 31 and the top wall 32 from the side in the +Y direction. In the embodiment, the second side wall 34 extends across the entire length of the first top wall portion 51 and the entire length of the second top wall portion 52 in the X direction. The second side wall 34 is an example of each of "sixth wall portion" and "second coupling portion".

The housing 10 includes the bottom wall 31, the top wall 32, the first side wall 33, and the second side wall 34 and has a flat rectangular tube shape. In the embodiment, the housing 10 includes a first single-piece member M1 and a second single-piece member M2. Hereinafter, this content will be described in detail.

<3.2 First Member>

Figure 6:
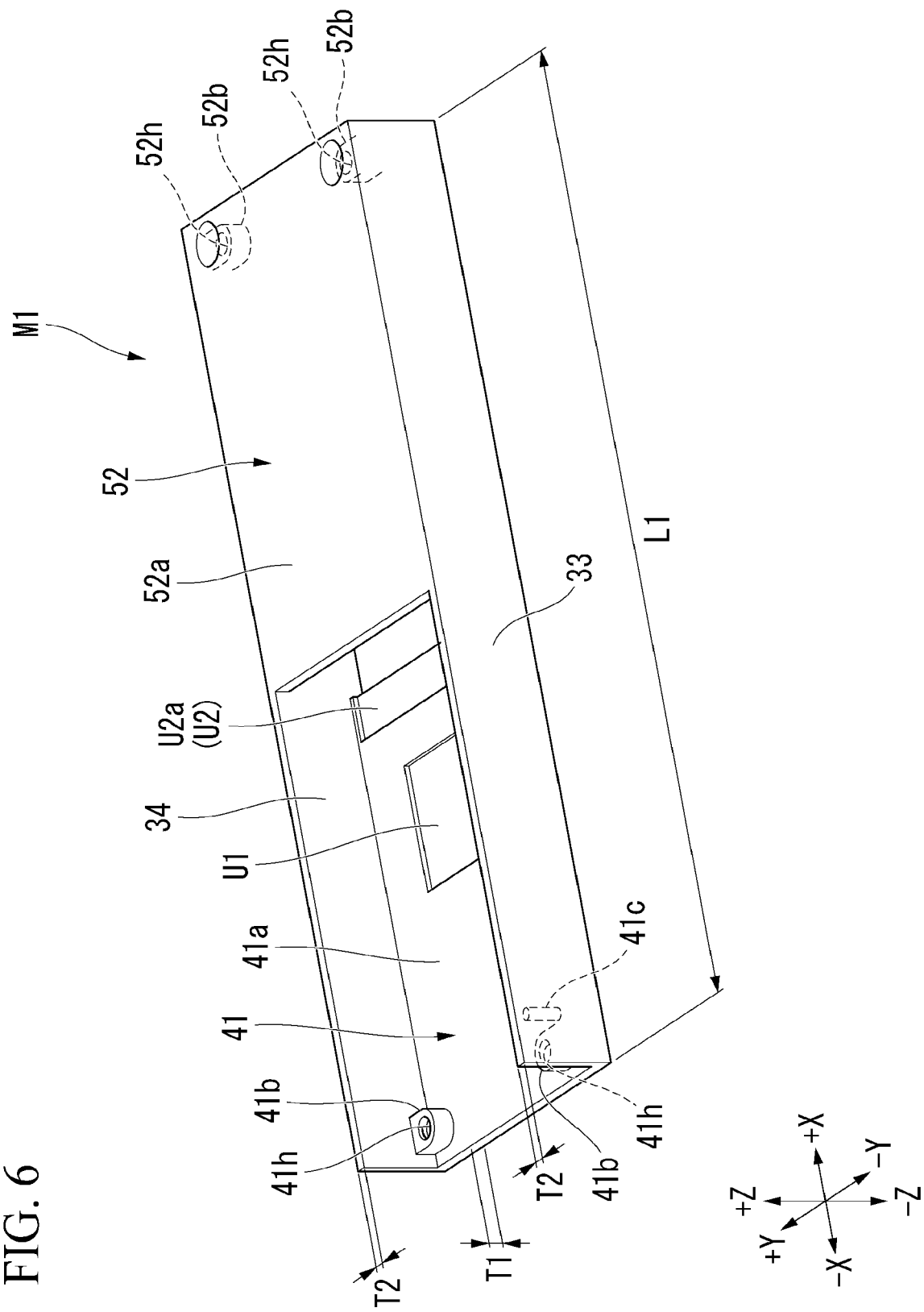
FIG. 6 is a perspective view showing a first member of the first embodiment.

FIG. 6 is a perspective view showing the first member M1. For example, the first member M1 includes the first bottom wall portion 41, the second top wall portion 52, the first side wall 33, and the second side wall 34. For example, the first member M1 is molded as a single body by extrusion using metal material.

The first bottom wall portion 41 includes a wall main body 41a having a plate shape, a pair of support portions 41b, a first recess U1, a first part U2a of a second recess U2, and one or more positioning pins 41c. The pair of support portions 41b, the first recess U1, the first part U2a of the second recess U2, and one or more positioning pins 41c are disposed on the outer surface of the wall main body 41a on the side in the +Z direction.

The pair of support portions 41b are disposed in an end portion of the first bottom wall portion 41 on the side in the −X direction. The pair of support portions 41b are separately positioned in both end portions of the first bottom wall portion 41 in the Y direction. The pair of support portions 41b protrude in the +Z direction from the outer surface of the wall main body 41a. The first end portion 21e1 of the board 21 is placed on the pair of support portions 41b. An engaging hole 41h with which the fixing member 80 is engaged is disposed in each of the pair of support portions 41b.

The first recess U1 and the first part U2a of the second recess U2 are recessed in the −Z direction from the outer surface of the wall main body 41a. The first recess U1 is a recess that is disposed at a position corresponding to the controller 23 to avoid the controller 23 (refer to FIG. 9). The second recess U2 is a recess that is disposed at a position corresponding to the plurality of first capacitors 28A to avoid the plurality of first capacitors 28A (refer to FIG. 9). In the embodiment, a part (first part U2a) of the second recess U2 is disposed in the first bottom wall portion 41.

The positioning pin 41c protrudes in the +Z direction from the outer surface of the wall main body 41a. The positioning pin 41c is inserted into the insertion hole 21hb of the board 21 and is used to position the board unit 20.

The second top wall portion 52 is positioned on the side in the +X direction and the side in the +Z direction with respect to the first bottom wall portion 41. The second top wall portion 52 includes a wall main body 52a having a plate shape and a pair of support portions 52b. The pair of support portions 52b are disposed on the outer surface of the wall main body 52a on the side in the −Z direction. The pair of support portions 52b are disposed in an end portion of the second top wall portion 52 on the side in the +X direction. The pair of support portions 52b are separately positioned in both end portions of the second top wall portion 52 in the Y direction. The pair of support portions 52b protrude in the −Z direction from the wall main body 52a. The pair of support portions 52b abut on the second end portion 21e2 of the board 21. An insertion hole 52h through which the fixing member 80 passes is disposed in each of the pair of support portions 52b.

The first side wall 33 is positioned in an end portion of the first member M1 on the side in the −Y direction. The first side wall 33 couples the end portion of the first bottom wall portion 41 on the side in the −Y direction to the end portion of the second top wall portion 52 on the side in the −Y direction. Meanwhile, the second side wall 34 is positioned in an end portion of the first member M1 on the side in the +Y direction. The second side wall 34 couples the end portion of the first bottom wall portion 41 on the side in the +Y direction to the end portion of the second top wall portion 52 on the side in the +Y direction. In the embodiment, a thickness T2 of each of the first side wall 33 and the second side wall 34 in the Y direction is less than a thickness T1 (for example, a thickness of the wall main body 41a) of the first bottom wall portion 41 in the Z direction.

By having the above configuration, a region in which the first bottom wall portion 41 is disposed in the first member M1 is formed in a bowl shape that is open in the +Z direction. In addition, a region in which the second top wall portion 52 is disposed in the first member M1 is formed in a bowl shape that is open in the −Z direction.

<3.3 Second Member>

Figure 7:
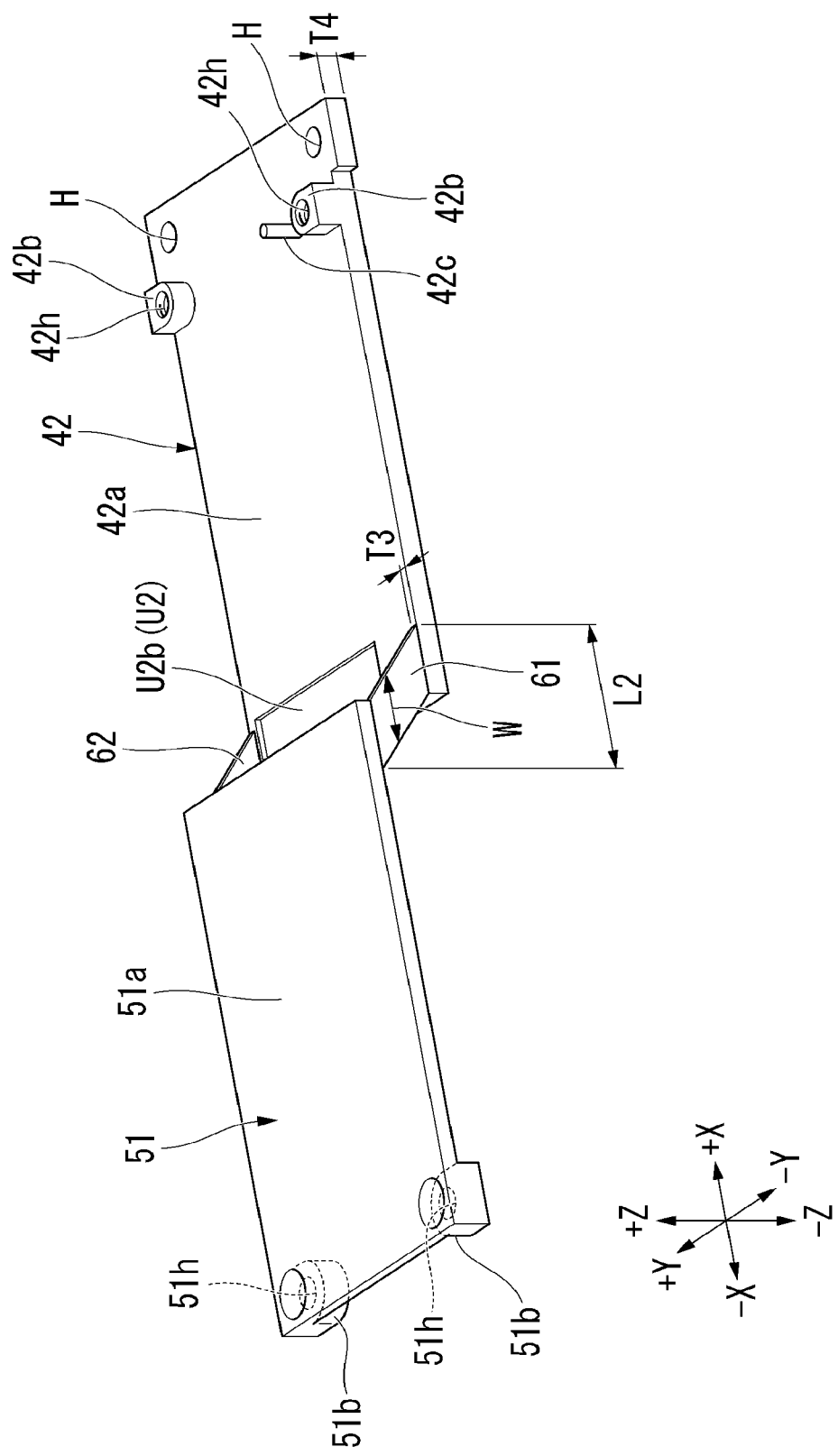
FIG. 7 is a perspective view showing a second member of the first embodiment.

FIG. 7 is a perspective view showing the second member M2. For example, the second member M2 includes the second bottom wall portion 42, the first top wall portion 51, a coupling portion 61, and a coupling portion 62. For example, the second member M2 is molded as a single body by extrusion using metal material.

The second bottom wall portion 42 includes a wall main body 42a having a plate shape, a pair of support portions 42b, a second part U2b of the second recess U2, and one or more rotation preventing pins 42c. The pair of support portions 42b, the second part U2b of the second recess U2, and one or more rotation preventing pins 42c are disposed on the outer surface of the wall main body 42a on the side in the +Z direction.

The pair of support portions 42b are disposed in an end portion of the second bottom wall portion 42 on the side in the +X direction. The pair of support portions 42b are separately positioned in both end portions of the second bottom wall portion 42 in the Y direction. The pair of support portions 42b protrude in the +Z direction from the outer surface of the wall main body 42a. The second end portion 21e2 of the board 21 is placed on the pair of support portions 42b. An engaging hole 42h with which the fixing member 80 is engaged is disposed in each of the pair of support portions 42b.

The second part U2b of the second recess U2 is recessed in the −Z direction from the outer surface of the wall main body 42a. The second part U2b of the second recess U2 is adjacent to the first part U2a of the second recess U2 of the first bottom wall portion 41 in the X direction. In other words, the second recess U2 is disposed across the first bottom wall portion 41 and the second bottom wall portion 42.

The rotation preventing pin 42c protrudes in the +Z direction from the outer surface of the wall main body 42a. The rotation preventing pin 42c is inserted into the insertion hole 21hc of the board 21 and, for example, is used to suppress rotation of the board unit 20 at a time of assembly.

The end portion of the second bottom wall portion 42 on the side in the +X direction protrudes in the +X direction compared to the end portion of the second top wall portion 52 on the side in the +X direction. The end portion of the second bottom wall portion 42 on the side in the +X direction functions as a knob portion that an operator holds when attaching the semiconductor storage device 1 to the host apparatus. One or more holes H used for fixing or positioning the semiconductor storage device 1 with respect to the host apparatus are disposed in the end portion of the second bottom wall portion 42 on the side in the +X direction.

The first top wall portion 51 is positioned on the side in the −X direction and the side in the +Z direction with respect to the second bottom wall portion 42. The first top wall portion 51 includes a wall main body 51a having a plate shape and a pair of support portions 51b. The pair of support portions 51b are disposed on the outer surface of the wall main body 51a on the side in the −Z direction. The pair of support portions 51b are disposed in an end portion of the first top wall portion 51 on the side in the −X direction. The pair of support portions 51b are separately positioned in both end portions of the first top wall portion 51 in the Y direction. The pair of support portions 51b protrude in the −Z direction from the wall main body 51a. The pair of support portions 51b abut on the first end portion 21e1 of the board 21. An insertion hole 51h through which the fixing member 80 passes is disposed in each of the pair of support portions 51b.

The coupling portion 61 and the coupling portion 62 are provided away from each other in the Y direction. For example, the coupling portion 61 and the coupling portion 62 are arranged between the first side wall 33 and the second side wall 34 of the first member M1 in the Y direction. For example, the coupling portion 61 is positioned in an end portion of the second member M2 on the side in the −Y direction. The coupling portion 61 couples the end portion of the first top wall portion 51 on the side in the −Y direction to the end portion of the second bottom wall portion 42 on the side in the −Y direction. Meanwhile, for example, the coupling portion 62 is positioned in an end portion of the second member M2 on the side in the +Y direction. The coupling portion 62 couples the end portion of the first top wall portion 51 on the side in the +Y direction to the end portion of the second bottom wall portion 42 on the side in the +Y direction. The board unit 20 is arranged between the coupling portion 61 and the coupling portion 62 in the Y direction. The coupling portion 61 is an example of a "third coupling portion". The coupling portion 62 is an example of a "fourth coupling portion".

In the embodiment, each of the coupling portion 61 and the coupling portion 62 extends in an inclined manner with respect to the X direction from the end portion of the first top wall portion 51 on the side in the +X direction toward the end portion of the second bottom wall portion 42 on the side in the −X direction. A length L2 of each of the coupling portion 61 and the coupling portion 62 in the X direction is less than a length L1 (refer to FIG. 6) of each of the first side wall 33 and the second side wall 34 in the X direction. From a different viewpoint, a width W (for example, the maximum width) of each of the coupling portion 61 and the coupling portion 62 in the X direction is less than the length L1 of each of the first side wall 33 and the second side wall 34 in the X direction. In the embodiment, a thickness T3 of each of the coupling portion 61 and the coupling portion 62 in the Y direction is less than a thickness T4 (refer to FIG. 7; for example, the thickness of the wall main body 42a) of the second bottom wall portion 42 in the Z direction.

Figure 8:
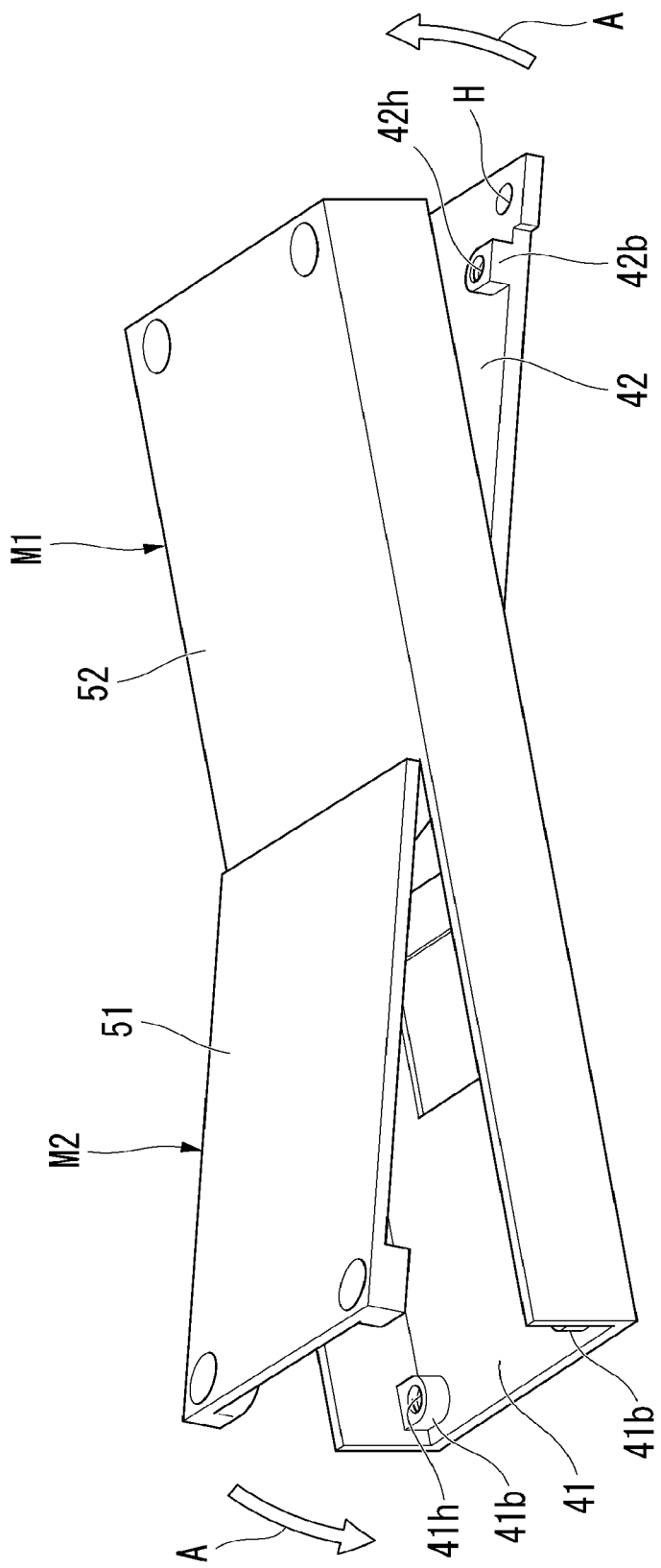
FIG. 8 is a diagram showing a method of attaching the second member to the first member in the first embodiment.

FIG. 8 is a diagram showing a method of attaching the second member M2 to the first member M1. In the embodiment, the second member M2 is inserted between the first side wall 33 and the second side wall 34 in an inclined attitude with respect to the first member M1. As shown by arrow A in FIG. 8, the second member M2 is pivoted with respect to the first member M1 such that the first top wall portion 51 becomes parallel to the first bottom wall portion 41, and the second bottom wall portion 42 becomes parallel to the second top wall portion 52. Accordingly, the first member M1 and the second member M2 are combined to form the housing 10.

In the embodiment, when the housing 10 is disassembled (when the first member M1 and the second member M2 are disassembled), the first bottom wall portion 41 and the second bottom wall portion 42 are separatable from each other. Similarly, when the housing 10 is disassembled (when the first member M1 and the second member M2 are disassembled), the first top wall portion 51 and the second top wall portion 52 are separatable from each other. In the present application, "separatable" is not limited to a case of being separatable in a completed product, and may include a case of being separatable by removing fixing members such as screws.

<3.4 Relationship Between Housing and Board Unit>

Figure 9:
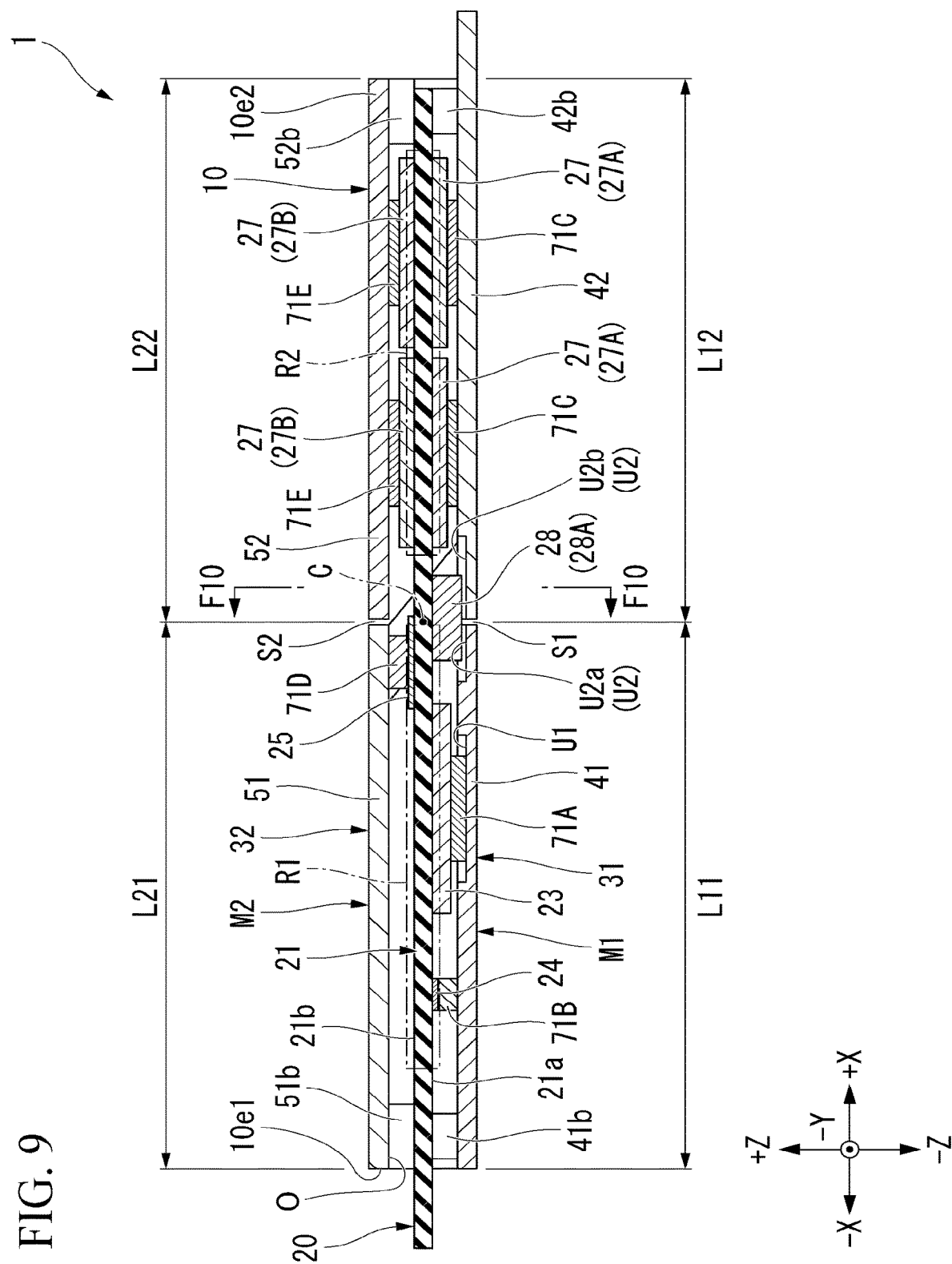
FIG. 9 is a cross-sectional view taken along line F9-F9 of the semiconductor storage device shown in FIG. 1.

FIG. 9 is a cross-sectional view taken along line F9-F9 of the semiconductor storage device 1 shown in FIG. 1. As shown in FIG. 9, the first bottom wall portion 41 faces the controller 23 and the power conversion component 24 from the side in the −Z direction. The first bottom wall portion 41 is coupled to the controller 23 with a thermally conductive member 71A (for example, a thermally conductive sheet) interposed therebetween. The first bottom wall portion 41 is coupled to the power conversion component 24 with a thermally conductive member 71B (for example, a thermally conductive sheet) interposed therebetween. Meanwhile, the second bottom wall portion 42 faces the plurality of first semiconductor memory components 27A from the side in the −Z direction. The second bottom wall portion 42 is coupled to the plurality of first semiconductor memory components 27A with a thermally conductive member 71C (for example, a thermally conductive sheet) interposed therebetween. One or more of the thermally conductive members 71A, 71B, and 71C may be omitted.

The first top wall portion 51 faces the power supply circuit component 25 from the side in the +Z direction. The first top wall portion 51 is coupled to the power supply circuit component 25 with a thermally conductive member 71D (for example, a thermally conductive sheet) interposed therebetween. Meanwhile, the second top wall portion 52 faces the plurality of second semiconductor memory components 27B from the side in the +Z direction. The second top wall portion 52 is coupled to the plurality of second semiconductor memory components 27B with a thermally conductive member 71E (for example, a thermally conductive sheet) interposed therebetween. One or more of the thermally conductive members 71D and 71E may be omitted.

In the embodiment, the bottom wall 31 includes a first gap S1 between the first bottom wall portion 41 and the second bottom wall portion 42 in the X direction. A longitudinal direction of the first gap S1 is along the Y direction (refer to FIG. 5). For example, the first gap S1 is disposed across the entire width of the second member M2 in the Y direction. The first gap S1 suppresses conduction of heat from the first bottom wall portion 41 toward the second bottom wall portion 42. The first gap S1 is a part having a lower thermal conductivity than the first bottom wall portion 41. The first gap S1 is an example of a "first part".

Similarly, the top wall 32 includes a second gap S2 between the first top wall portion 51 and the second top wall portion 52 in the X direction. A longitudinal direction of the second gap S2 is along the Y direction (refer to FIG. 5). For example, the second gap S2 is disposed across the entire width of the second member M2 in the Y direction. The second gap S2 suppresses conduction of heat from the first top wall portion 51 toward the second top wall portion 52. The second gap S2 is a part having a lower thermal conductivity than the first top wall portion 51. The second gap S2 is an example of a "second part".

In the embodiment, the first gap S1 and the second gap S2 are exposed to the outside of the housing 10. Air that flows outside the housing 10 can flow into the housing 10 through the first gap S1 and the second gap S2. In the embodiment, by disposing the first gap S1 and the second gap S2, interference between the first member M1 and the second member M2 at a time of assembly of the housing 10 can be avoided. That is, by disposing the first gap S1 and the second gap S2, the second member M2 can be pivoted with respect to the first member M1 after the second member M2 is combined with the first member M1 in an inclined attitude.

As shown in FIG. 9, the housing 10 includes a first end 10e1 and a second end 10e2 opposite to the first end 10e1 in the X direction. The first end 10e1 is an end on the side in the −X direction. The second end 10e2 is an end on the side in the +X direction. Additionally, the housing 10 has a center C. The first gap S1 (that is, a first boundary portion between the first bottom wall portion 41 and the second bottom wall portion 42) is positioned closer to the center C of the housing 10 than to the first end 10e1 and the second end 10e2 of the housing 10 in the X direction. In other words, a distance L11 between the first gap S1 and the first end 10e1 of the housing 10 is longer than the distance between the first gap S1 and the center C of the housing 10 (substantially zero in the example shown in FIG. 9) in the X direction. Furthermore, a distance L12 between the first gap S1 and the second end 10e2 of the housing 10 is longer than the distance between the first gap S1 and the center C of the housing 10 (substantially zero in the example shown in FIG. 9) in the X direction. Similarly, the second gap S2 (that is, a second boundary portion between the first top wall portion 51 and the second top wall portion 52) is positioned closer to the center C of the housing 10 than to the first end 10e1 and the second end 10e2 of the housing 10 in the X direction. In other words, a distance L21 between the second gap S2 and the first end 10e1 of the housing 10 is longer than the distance between the second gap S2 and the center C of the housing 10 (substantially zero in the example shown in FIG. 9) in the X direction. Furthermore, a distance L22 between the second gap S2 and the second end 10e2 of the housing 10 is longer than the distance between the second gap S2 and the center C of the housing 10 (substantially zero in the example shown in FIG. 9) in the X direction.

Figure 10:
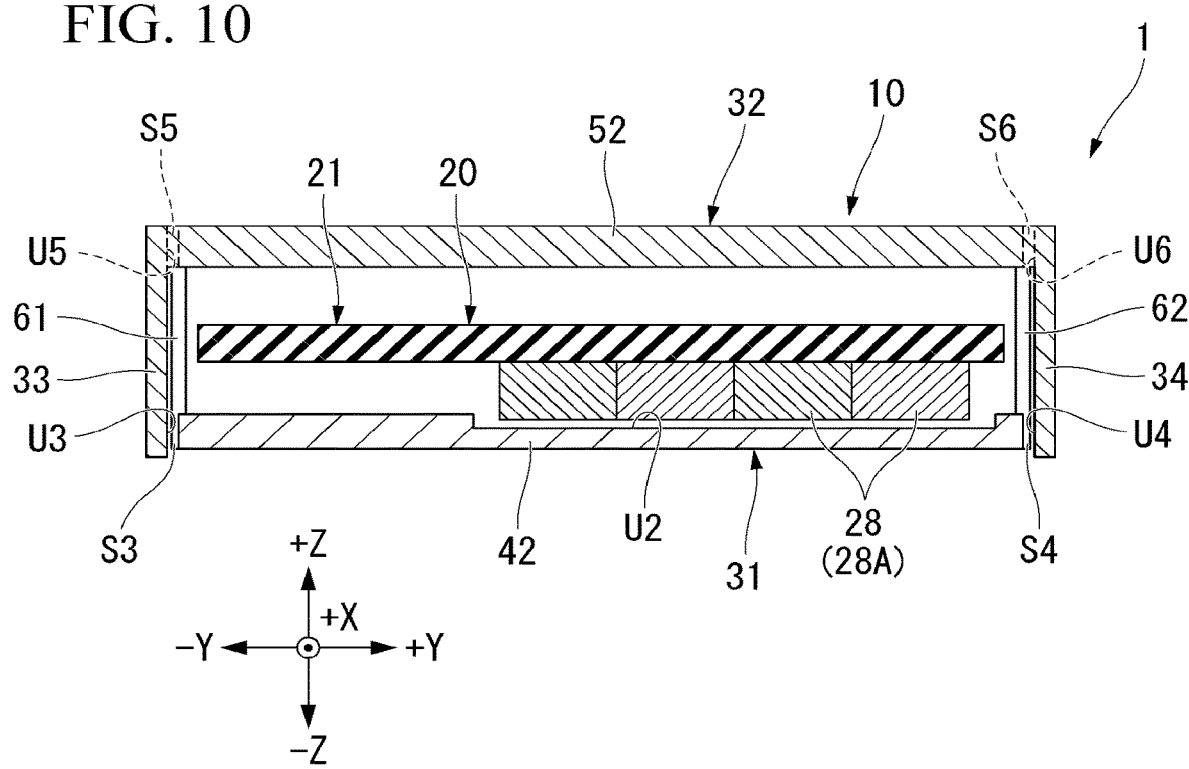
FIG. 10 is a cross-sectional view taken along line F10-F10 of the semiconductor storage device shown in FIG. 9.

FIG. 10 is a cross-sectional view taken along line F10-F10 of the semiconductor storage device 1 shown in FIG. 9. In the embodiment, the second bottom wall portion 42 is arranged between the first side wall 33 and the second side wall 34 in the Y direction. A third gap S3 is disposed between the second bottom wall portion 42 and the first side wall 33 in the Y direction. A fourth gap S4 is disposed between the second bottom wall portion 42 and the second side wall 34 in the Y direction.

Figure 11:
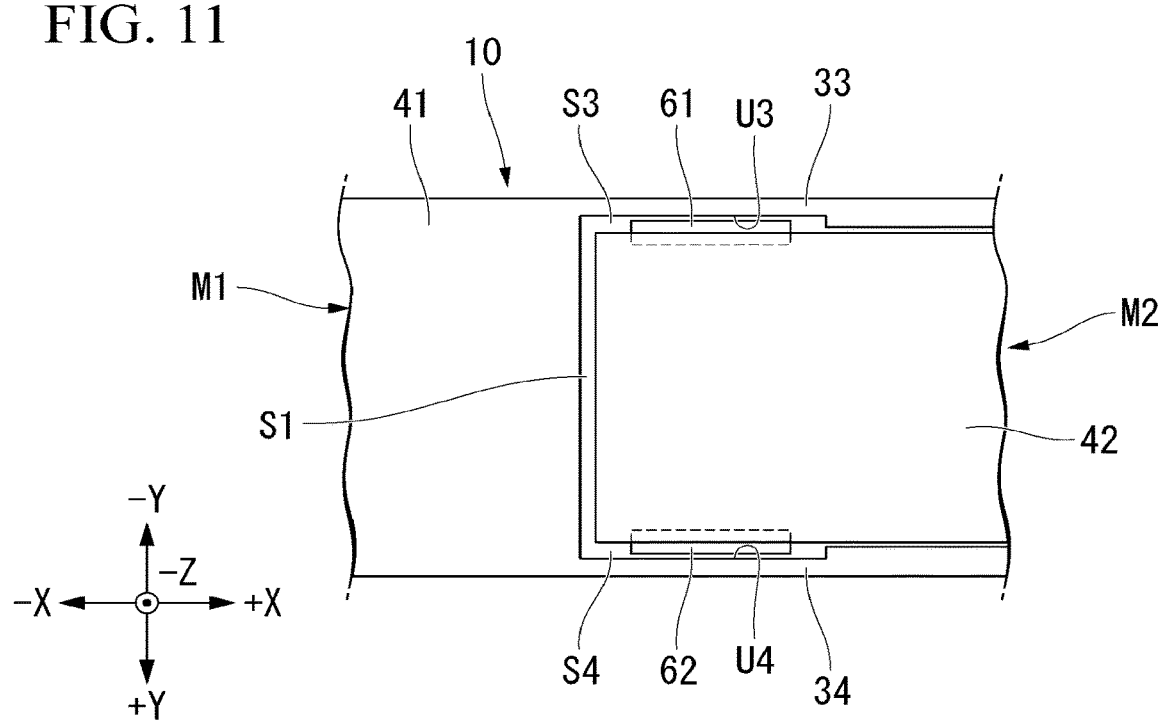
FIG. 11 is a bottom view showing a part of a bottom wall of the housing of the first embodiment.

FIG. 11 is a bottom view showing a part of the bottom wall 31 of the housing 10. The third gap S3 and the fourth gap S4 communicate with the first gap S1. A longitudinal direction of each of the third gap S3 and the fourth gap S4 is along the X direction. The third gap S3 and the fourth gap S4 are exposed to the outside of the housing 10. Air that flows outside the housing 10 can flow into the housing 10 through the third gap S3 and the fourth gap S4.

As shown in FIG. 11, in the embodiment, a part of the coupling portion 61 is disposed to protrude to the side in the −Y direction with respect to the end portion of the second bottom wall portion 42 on the side in the −Y direction. Accordingly, the strength of the coupling portion 61 is secured while a large accommodation space for accommodating the board unit 20 is secured. The third gap S3 is formed by a recess U3 disposed in the first side wall 33 to avoid interference of the coupling portion 61, which protrudes from the second bottom wall portion 42, with the first side wall 33. Similarly, a part of the coupling portion 62 is disposed to protrude to the side in the +Y direction with respect to the end portion of the second bottom wall portion 42 on the side in the +Y direction. Accordingly, the strength of the coupling portion 62 is secured while a large accommodation space for accommodating the board unit 20 is secured. The fourth gap S4 is formed by a recess U4 disposed in the second side wall 34 to avoid interference of the coupling portion 62, which protrudes from the second bottom wall portion 42, with the second side wall 34.

Similarly, the first top wall portion 51 is arranged between the first side wall 33 and the second side wall 34 in the Y direction (refer to FIG. 5). A fifth gap S5 is disposed between the first top wall portion 51 and the first side wall 33 in the Y direction. A sixth gap S6 is disposed between the first top wall portion 51 and the second side wall 34 in the Y direction. For example, the fifth gap S5 and the sixth gap S6 have shapes similar to the third gap S3 and the fourth gap S4. That is, the fifth gap S5 and the sixth gap S6 communicate with the second gap S2. A longitudinal direction of each of the fifth gap S5 and the sixth gap S6 is along the X direction. The fifth gap S5 and the sixth gap S6 are exposed to the outside of the housing 10. Air that flows outside the housing 10 can flow into the housing 10 through the fifth gap S5 and the sixth gap S6.

In the embodiment, a part of the coupling portion 61 is disposed to protrude to the side in the −Y direction with respect to the end portion of the first top wall portion 51 on the side in the −Y direction. Accordingly, the strength of the coupling portion 61 is secured while a large accommodation space for accommodating the board unit 20 is secured. The fifth gap S5 is formed by a recess U5 disposed in the first side wall 33 to avoid interference of the coupling portion 61, which protrudes from the first top wall portion 51, with the first side wall 33. A part of the coupling portion 62 is disposed to protrude to the side in the +Y direction with respect to the end portion of the first top wall portion 51 on the side in the +Y direction. Accordingly, the strength of the coupling portion 62 is secured while a large accommodation space for accommodating the board unit 20 is secured. The sixth gap S6 is formed by a recess U6 disposed in the second side wall 34 to avoid interference of the coupling portion 62, which protrudes from the first top wall portion 51, with the second side wall 34. For example, shapes of the recess U5 and the recess U6 are the same as the recess U3 and the recess U4 shown in FIG. 11.

<4. Fixing Member>

The plurality of fixing members 80 will be described by referring to FIG. 1. The plurality of fixing members 80 fix the first member M1 and the second member M2. In the embodiment, the plurality of fixing members 80 jointly fix the first member M1 and the second member M2 to the board 21. For example, the plurality of fixing member 80 include a plurality of first fixing members 80A and a plurality of second fixing members 80B.

Each first fixing member 80A passes through the insertion hole 51h of the support portion 51b of the first top wall portion 51 and the insertion hole 21ha of the board 21 and engages with the engaging hole 41h of the support portion 41b of the first bottom wall portion 41. Accordingly, the first top wall portion 51 and the first bottom wall portion 41 are fixed, and the board 21 is fixed by being sandwiched between the support portions 51b of the first top wall portion 51 and the support portions 41b of the first bottom wall portion 41.

Each second fixing member 80B passes through the insertion hole 52h of the support portion 52b of the second top wall portion 52 and the insertion hole 21ha of the board 21 and engages with the engaging hole 42h of the support portion 42b of the second bottom wall portion 42. Accordingly, the second top wall portion 52 and the second bottom wall portion 42 are fixed, and the board 21 is fixed by being sandwiched between the support portions 52b of the second top wall portion 52 and the support portions 42b of the second bottom wall portion 42.

Here, an example of a method of attaching the board unit 20 will be described. For example, the board unit 20 is inserted between the first member M1 and the second member M2 in a state (state shown in FIG. 8) where the second member M2 is inserted into the first member M1 in an inclined attitude. For example, by inserting the positioning pin 41c (refer to FIG. 6) into the insertion hole 21hb of the board 21 and inserting the rotation preventing pin 42c (refer to FIG. 7) into the insertion hole 21hc of the board 21 in the board unit 20, the board unit 20 is positioned, and rotation of the board unit 20 is suppressed.

In this state, the board unit 20 is sandwiched between the first member M1 and the second member M2 by pivoting the second member M2 in a direction of arrow A in FIG. 8 with respect to the first member M1. In the embodiment, the first end portion 21e1 of the board 21 is sandwiched between the support portions 41b of the first bottom wall portion 41 and the support portions 51b of the first top wall portion 51. Furthermore, the second end portion 21e2 of the board 21 is sandwiched between the support portions 42b of the second bottom wall portion 42 and the support portions 52b of the second top wall portion 52. In this state, the board unit 20 is fixed to the housing 10 by attaching the plurality of fixing members 80 to the housing 10. The method of attaching the board unit 20 is not limited to the above example. For example, the second member M2 may be attached to the first member M1 after the board unit 20 is attached to the second member M2.

<5. Action>

As described above, for example, the controller 23 and the power conversion component 24 are coupled to the first bottom wall portion 41 through the thermally conductive members 71A and 71B. Thus, a part of heat generated from the controller 23 and the power conversion component 24 is conducted to the first bottom wall portion 41 through the thermally conductive members 71A and 71B. Thus, temperature of the first bottom wall portion 41 is increased. However, since the first bottom wall portion 41 and the second bottom wall portion 42 are not formed as a single body, heat conducted to the first bottom wall portion 41 from the controller 23 and the power conversion component 24 is not easily conducted to the second bottom wall portion 42 from the first bottom wall portion 41. Thus, the temperature of the second bottom wall portion 42 is not easily increased compared to a case in which the first bottom wall portion 41 and the second bottom wall portion 42 are formed as a single body. Consequently, temperature of the semiconductor memory components 27 (for example, the first semiconductor memory components 27A) that have lower heat resistance than the controller 23 and the power conversion component 24 can be suppressed from increasing.

Here, a part of the heat conducted to the first bottom wall portion 41 from the controller 23 and the power conversion component 24 is conducted to the second top wall portion 52 through the first side wall 33 and the second side wall 34. However, the amount of heat conducted to the second top wall portion 52 from the first bottom wall portion 41 through the first side wall 33 and the second side wall 34 is less than the amount of heat conducted to the top wall 32 from the bottom wall 31 through the first side wall 33 and the second side wall 34 in a case in which the first bottom wall portion 41 and the second bottom wall portion 42 are formed as a single body. Thus, temperature of the semiconductor memory components 27 (for example, the second semiconductor memory components 27B) are suppressed from increasing.

Similarly, for example, the power supply circuit component 25 is coupled to the first top wall portion 51 through the thermally conductive member 71D. Thus, a part of heat generated from the power supply circuit component 25 is conducted to the first top wall portion 51 through the thermally conductive member 71D. Thus, temperature of the first top wall portion 51 is increased. However, since the first top wall portion 51 and the second top wall portion 52 are not formed as a single body, the heat conducted to the first top wall portion 51 from the power supply circuit component 25 is not easily conducted to the second top wall portion 52 from the first top wall portion 51. Thus, temperature of the second top wall portion 52 is not easily increased compared to a case in which the first top wall portion 51 and the second top wall portion 52 are formed as a single body. Consequently, temperature of the semiconductor memory components 27 (for example, the second semiconductor memory components 27B) that have lower heat resistance than the power supply circuit component 25 can be suppressed from increasing.

Here, a part of the heat conducted to the first top wall portion 51 from the power supply circuit component 25 is conducted to the second bottom wall portion 42 through the coupling portion 61 and the coupling portion 62. However, the amount of heat conducted to the second bottom wall portion 42 from the first top wall portion 51 through the coupling portion 61 and the coupling portion 62 is less than the amount of heat conducted to the bottom wall 31 from the top wall 32 through the first side wall 33 and the second side wall 34 in a case in which the first top wall portion 51 and the second top wall portion 52 are formed as a single body. Thus, temperature of the semiconductor memory components 27 (for example, the first semiconductor memory components 27A) is suppressed from increasing.

<6. Advantage>

In the embodiment, the housing 10 includes the first bottom wall portion 41 that is positioned on the side in the −Z direction with respect to the board 21 and faces the first region R1 of the board 21, the second bottom wall portion 42 that is positioned on the side in the −Z direction with respect to the board 21 and faces the second region R2 of the board 21, the first top wall portion 51 that is positioned on the side in the +Z direction with respect to the board 21 and faces the first region R1 of the board 21, and the second top wall portion 52 that is positioned on the side in the +Z direction with respect to the board 21 and faces the second region R2 of the board 21. The first bottom wall portion 41 and the second top wall portion 52 are formed by the first single-piece member M1. The second bottom wall portion 42 and the first top wall portion 51 are formed by the second single-piece member M2. According to this configuration, conduction of heat from the first bottom wall portion 41 to the second bottom wall portion 42 is suppressed compared to a case in which the first bottom wall portion 41 and the second bottom wall portion 42 are formed as a single body. Conduction of heat from the first top wall portion 51 to the second top wall portion 52 is suppressed compared to a case in which the first top wall portion 51 and the second top wall portion 52 are formed as a single body. Accordingly, an increase in temperature of the semiconductor memory components 27 can be suppressed. Consequently, reliability of the semiconductor storage device 1 can be improved.

In the embodiment, the housing 10 includes the first part having a lower thermal conductivity than the first bottom wall portion 41 between the first bottom wall portion 41 and the second bottom wall portion 42. According to this configuration, conduction of heat from the first bottom wall portion 41 to the second bottom wall portion 42 can be further suppressed.

In the embodiment, the first part is the first gap S1 disposed between the first bottom wall portion 41 and the second bottom wall portion 42. According to this configuration, conduction of heat from the first bottom wall portion 41 to the second bottom wall portion 42 can be further suppressed. In addition, when the semiconductor storage device 1 is installed in an environment where cooling air is supplied around the housing 10, it can be expected that a part of the cooling air flows into the housing 10 from the first gap S1. Accordingly, an increase in temperature of the semiconductor memory components 27 can be further suppressed.

In the embodiment, the housing 10 includes the second part having a lower thermal conductivity than the first top wall portion 51 between the first top wall portion 51 and the second top wall portion 52. According to this configuration, conduction of heat from the first top wall portion 51 to the second top wall portion 52 can be further suppressed.

In the embodiment, the first member M1 includes the first side wall 33 and the second side wall 34 that are separately disposed in both end portions of the housing 10 in the Y direction and each couple the first bottom wall portion 41 to the second top wall portion 52. The second member M2 includes the coupling portion 61 and the coupling portion 62 that are arranged between the first side wall 33 and the second side wall 34 in the Y direction and each couple the second bottom wall portion 42 to the first top wall portion 51. According to this configuration, by a relatively simple configuration, the first bottom wall portion 41 can be coupled to the second top wall portion 52, and the second bottom wall portion 42 can be coupled to the first top wall portion 51. Consequently, a large internal space of the housing 10 is easily secured.

In the embodiment, the first side wall 33 and the second side wall 34 are exposed to the outside of the housing 10. According to this configuration, when the semiconductor storage device 1 is installed in the environment where the cooling air is supplied around the housing 10, the first side wall 33 and the second side wall 34 that couple the first bottom wall portion 41 to the second top wall portion 52 are cooled by the cooling air. Thus, conduction of heat from the first bottom wall portion 41 to the second top wall portion 52 can be further suppressed.

In the embodiment, the thickness T2 of the first side wall 33 in the Y direction is less than the thickness T1 of the first bottom wall portion 41 in the Z direction. According to this configuration, heat is not easily conducted through the first side wall 33 compared to a case in which the first side wall 33 is thick. Thus, conduction of heat from the first bottom wall portion 41 to the second top wall portion 52 can be further suppressed.

In the embodiment, the length L2 of the coupling portion 61 in the X direction is less than the length L1 of the first side wall 33 in the X direction. That is, the coupling portion 61 that is expected to be not easily cooled by the cooling air supplied around the housing 10 is formed to be relatively small. According to this configuration, since the coupling portion 61 is relatively small, heat is not easily conducted through the coupling portion 61. Thus, conduction of heat from the first top wall portion 51 to the second bottom wall portion 42 can be further suppressed.

In the embodiment, the thickness T3 of the coupling portion 61 in the Y direction is less than the thickness T4 of the second bottom wall portion 42 in the Z direction. According to this configuration, heat is not easily conducted through the coupling portion 61 compared to a case in which the coupling portion 61 is thick. Thus, conduction of heat from the first top wall portion 51 to the second bottom wall portion 42 can be further suppressed.

In the embodiment, the housing 10 includes the third gap S3 that is disposed between the second member M2 and the first side wall 33 in the Y direction and is exposed to the outside of the housing 10. According to this configuration, when the semiconductor storage device 1 is installed in the environment where the cooling air is supplied around the housing 10, it can be expected that a part of the cooling air flows into the housing 10 from the third gap S3. Accordingly, an increase in temperature of the semiconductor memory components 27 can be further suppressed.

In the embodiment, the longitudinal direction of the third gap S3 is the X direction. According to this configuration, when the semiconductor storage device 1 is installed in the environment where the cooling air is supplied around the housing 10 along the X direction, it can be expected that more cooling air flows into the housing 10 from the third gap S3.

In the embodiment, the boundary portion between the first bottom wall portion 41 and the second bottom wall portion 42 is positioned closer to the center C of the housing 10 than to the first end 10e1 and the second end 10e2 of the housing 10 in the X direction. The boundary portion between the first top wall portion 51 and the second top wall portion 52 is positioned closer to the center C of the housing 10 than to the first end 10e1 and the second end 10e2 of the housing 10 in the X direction. According to this configuration, for example, in an assembly work that accompanies a pivoting work shown in FIG. 8, stability of the assembly work can be improved compared to a case in which the boundary portion is positioned close to the first end 10e1 or the second end 10e2 of the housing 10.

In the embodiment, an inner surface of the housing 10 includes the second recess U2 that avoids the capacitors 28. The second recess U2 is disposed across the first bottom wall portion 41 and the second bottom wall portion 42. According to this configuration, a part of adjacent portions of the first bottom wall portion 41 and the second bottom wall portion 42 is formed to be thin, and conduction of heat from the first bottom wall portion 41 to the second bottom wall portion 42 can be further suppressed.

In the embodiment, the board 21 is fixed by being sandwiched between the first bottom wall portion 41 and the first top wall portion 51 and is fixed by being sandwiched between the second bottom wall portion 42 and the second top wall portion 52. According to this configuration, the board 21 can be stably fixed in a configuration in which the first bottom wall portion 41 and the second bottom wall portion 42 are not formed as a single body, and the first top wall portion 51 and the second top wall portion 52 are not formed as a single body.

Second Embodiment

Next, a second embodiment will be described. Configurations other than those described below in the second embodiment are the same as the configurations of the first embodiment.

Figure 12:
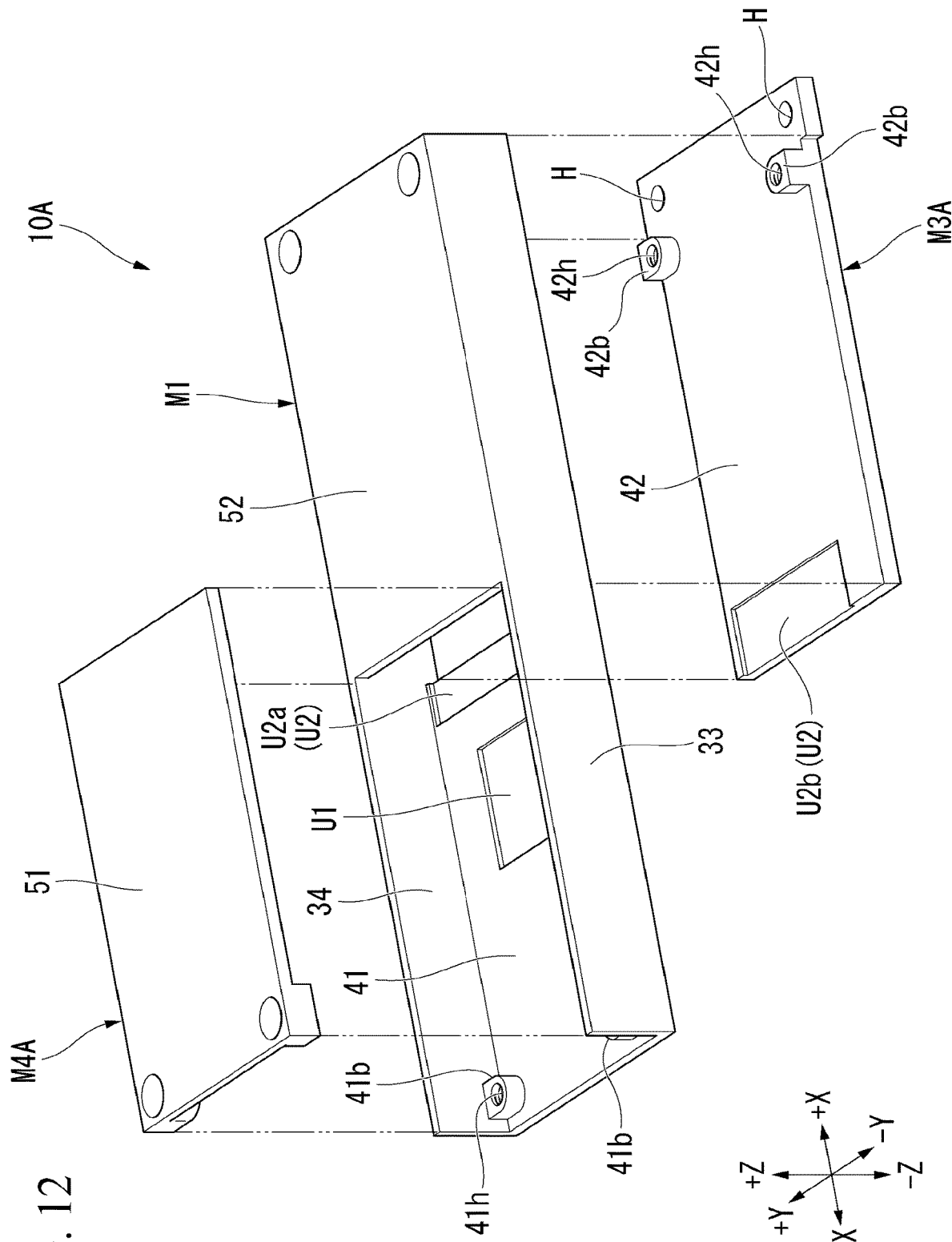
FIG. 12 is an exploded perspective view showing a housing of a second embodiment.

FIG. 12 is an exploded perspective view showing a housing 10A of the second embodiment. In the embodiment, the housing 10A includes the first single-piece member M1, a third single-piece member M3A, and a fourth single-piece member M4A.

In the same manner as in the first embodiment, the first member M1 includes the first bottom wall portion 41, the second top wall portion 52, the first side wall 33, and the second side wall 34. The third member M3A includes the second bottom wall portion 42. The fourth member M4A includes the first top wall portion 51. That is, in the embodiment, the second bottom wall portion 42 and the first top wall portion 51 are formed by a plurality of different members. The third member M3A (that is, the second bottom wall portion 42) and the fourth member M4A (that is, the first top wall portion 51) are separately attached to the first member M1. In the embodiment, the first bottom wall portion 41 is an example of the "first wall portion". The second bottom wall portion 42 is an example of the "second wall portion". The first top wall portion 51 is an example of the "third wall portion". The second top wall portion 52 is an example of the "fourth wall portion".

In the embodiment, when the housing 10A is disassembled (when the first member M1 and the third member M3A are disassembled), the first bottom wall portion 41 and the second bottom wall portion 42 are separatable from each other. Similarly, when the housing 10A is disassembled (when the first member M1 and the fourth member M4A are disassembled), the first top wall portion 51 and the second top wall portion 52 are separatable from each other.

Even with this configuration, conduction of heat from the first bottom wall portion 41 to the second bottom wall portion 42 and conduction of heat from the first top wall portion 51 to the second top wall portion 52 can be suppressed. Consequently, the reliability of the semiconductor storage device 1 can be improved.

Third Embodiment

Next, a third embodiment will be described. Configurations other than those described below in the third embodiment are the same as the configurations of the first embodiment.

Figure 13:
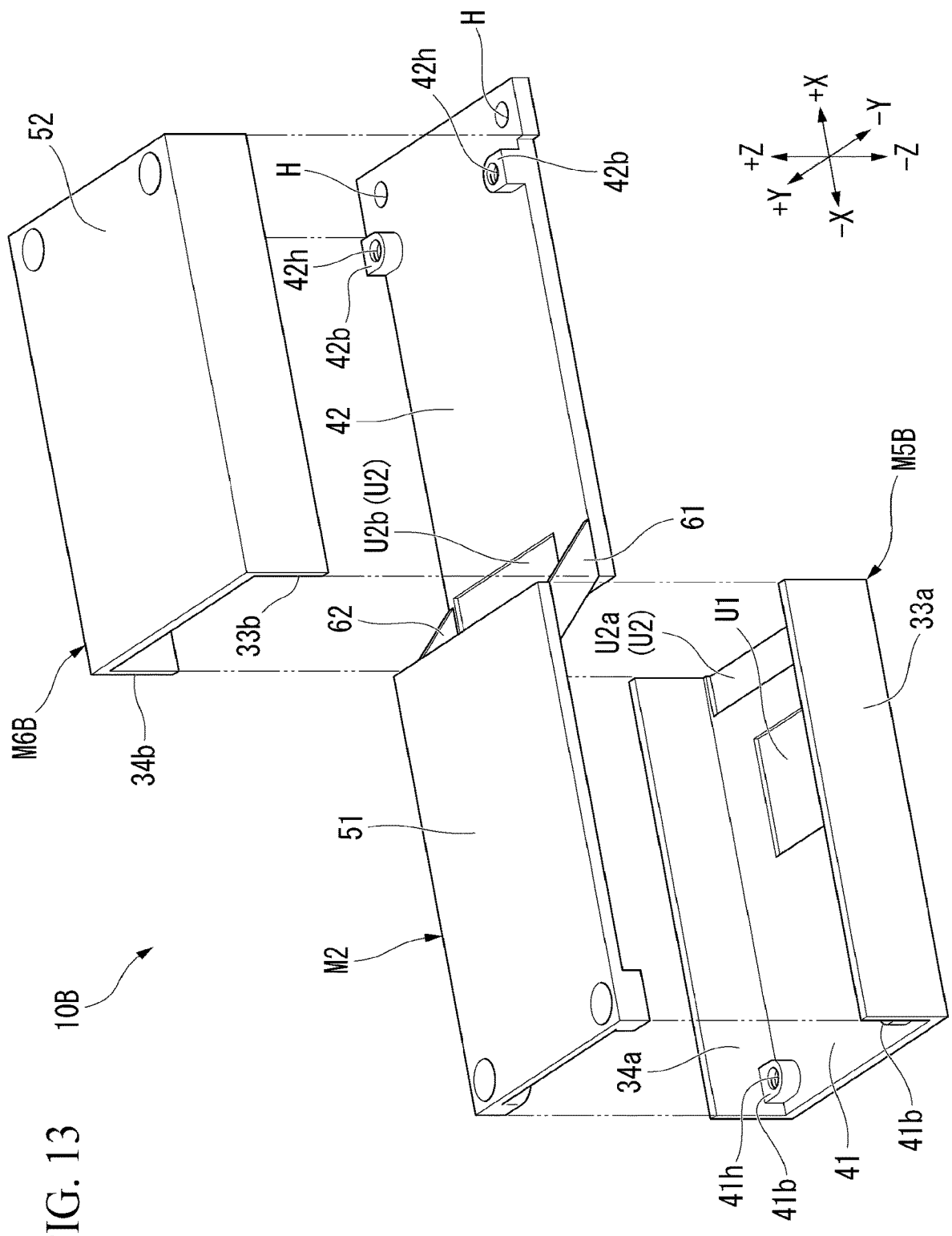
FIG. 13 is an exploded perspective view showing a housing of a third embodiment.

FIG. 13 is an exploded perspective view showing a housing 10B of the third embodiment. In the embodiment, the housing 10B includes a fifth single-piece member M5B, a sixth single-piece member M6B, and the second single-piece member M2.

In the same manner as in the first embodiment, the second member M2 includes the first top wall portion 51, the second bottom wall portion 42, the coupling portion 61, and the coupling portion 62. The fifth member M5B includes the first bottom wall portion 41, a first part 33a that is a part of the first side wall 33, and a first part 34a that is a part of the second side wall 34. The sixth member M6B includes the second top wall portion 52, a second part 33b that is the rest of the first side wall 33, and a second part 34b that is the rest of the second side wall 34. That is, in the embodiment, the first bottom wall portion 41 and the second top wall portion 52 are formed by a plurality of different members. The fifth member M5B (that is, the first bottom wall portion 41) and the sixth member M6B (that is, the second top wall portion 52) are separately attached to the second member M2. In the embodiment, the first top wall portion 51 is an example of the "first wall portion". The second top wall portion 52 is an example of the "second wall portion". The first bottom wall portion 41 is an example of the "third wall portion". The second bottom wall portion 42 is an example of the "fourth wall portion".

In the embodiment, when the housing 10B is disassembled (when the fifth member M5B and the second member M2 are disassembled), the first bottom wall portion 41 and the second bottom wall portion 42 are separatable from each other. Similarly, when the housing 10B is disassembled (when the sixth member M6B and the second member M2 are disassembled), the first top wall portion 51 and the second top wall portion 52 are separatable from each other.

Even with this configuration, conduction of heat from the first bottom wall portion 41 to the second bottom wall portion 42 and conduction of heat from the first top wall portion 51 to the second top wall portion 52 can be suppressed. Consequently, the reliability of the semiconductor storage device 1 can be improved.

Fourth Embodiment

Next, a fourth embodiment will be described. Configurations other than those described below in the fourth embodiment are the same as the configurations of the first embodiment.

Figure 14:
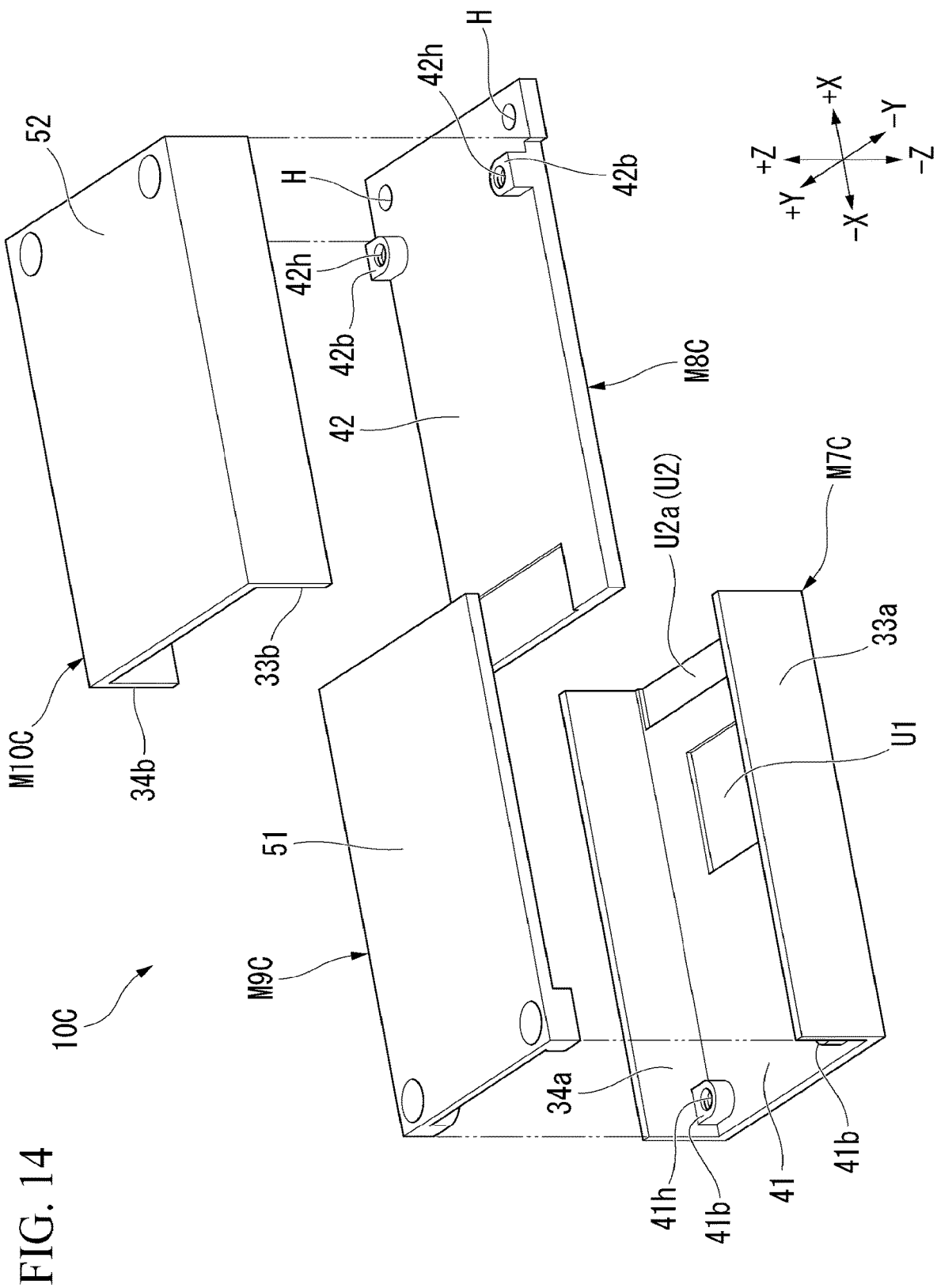
FIG. 14 is an exploded perspective view showing a housing of a fourth embodiment.

FIG. 14 is an exploded perspective view showing a housing 10C of the fourth embodiment. In the embodiment, the housing 10C includes a seventh single-piece member M7C, an eighth single-piece member M8C, a ninth single-piece member M9C, and a tenth single-piece member M10C.

The seventh member M7C includes the first bottom wall portion 41, the first part 33a that is a part of the first side wall 33, and the first part 34a that is a part of the second side wall 34. The eighth member M8C includes the second bottom wall portion 42. The ninth member M9C includes the first top wall portion 51. The tenth member M10C includes the second top wall portion 52, the second part 33b that is the rest of the first side wall 33, and the second part 34b that is the rest of the second side wall 34. That is, in the embodiment, the first bottom wall portion 41, the second bottom wall portion 42, the first top wall portion 51, and the second top wall portion 52 are formed by a plurality of different members. In the embodiment, the first bottom wall portion 41 is an example of the "first wall portion". The second bottom wall portion 42 is an example of the "second wall portion". The first top wall portion 51 is an example of the "third wall portion". The second top wall portion 52 is an example of the "fourth wall portion".

In the embodiment, when the housing 10C is disassembled (when the seventh member M7C and the eighth member M8C are disassembled), the first bottom wall portion 41 and the second bottom wall portion 42 are separatable from each other. Similarly, when the housing 10C is disassembled (when the ninth member M9C and the tenth member M10C are disassembled), the first top wall portion 51 and the second top wall portion 52 are separatable from each other.

Even with this configuration, conduction of heat from the first bottom wall portion 41 to the second bottom wall portion 42 and conduction of heat from the first top wall portion 51 to the second top wall portion 52 can be suppressed. Consequently, the reliability of the semiconductor storage device 1 can be improved.

While several embodiments are described above, embodiments are not limited to the above examples. For example, instead of/in addition to forming the second recess U2 for avoiding the electronic component (for example, the capacitors 28) across the first bottom wall portion 41 and the second bottom wall portion 42, the same recess may be formed across the first top wall portion 51 and the second top wall portion 52. In the embodiments, the controller 23 is mounted in the first region R1 of the board 21, and the semiconductor memory components 27 are mounted in the second region R2 of the board 21. Instead, the semiconductor memory components 27 may be mounted in the first region R1 of the board 21, and the controller 23 may be mounted in the second region R2 of the board 21. The first side wall 33 serving as "first coupling portion" is not limited to a wall portion extending across the entire length of the first top wall portion 51 and the entire length of the second top wall portion 52. The first side wall 33 may be a wall portion extending across at least a part of the entire length of the first top wall portion 51 or across at least a part of the entire length of the second top wall portion 52. In this case, a side wall of the housing 10 may be formed by the first coupling portion and the third coupling portion combined to the first coupling portion. Similarly, the second side wall 34 serving as "second coupling portion" is not limited to a wall portion extending across the entire length of the first top wall portion 51 and the entire length of the second top wall portion 52. The second side wall 34 may be a wall portion extending across at least a part of the entire length of the first top wall portion 51 or across at least a part of the entire length of the second top wall portion 52. In this case, a side wall of the housing 10 may be formed by the second coupling portion and the fourth coupling portion combined to the second coupling portion.

According to at least one of the embodiments described above, a housing of a semiconductor storage device includes a first wall portion that is positioned on a first side with respect to a board in a first direction which is a thickness direction of the board, and faces a first region of the board; a second wall portion that is positioned on the first side with respect to the board in the first direction and faces a second region of the board; a third wall portion that is positioned on a second side which is a side opposite to the first side, with respect to the board in the first direction and faces the first region; and a fourth wall portion that is positioned on the second side with respect to the board in the first direction and faces the second region. The first wall portion and the second wall portion are separatable from each other. The third wall portion and the fourth wall portion are separatable from each other. According to this configuration, reliability of the semiconductor storage device can be improved.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a housing;
a board in the housing, the board including a first region and a second region different from the first region;
a controller in one of the first region and the second region; and
a semiconductor memory component in the other of the first region and the second region, wherein
the controller is configured to control the semiconductor memory component, the housing includes a first wall portion, a second wall portion, a third wall portion, and a fourth wall portion,
the first wall portion is on a first side with respect to the board in a first direction that is a thickness direction of the board, the first wall portion faces the first region, and the first wall portion does not overlap the second wall portion when viewed from the first direction,
the second wall portion is on the first side with respect to the board in the first direction, the second wall portion faces the second region, and the second wall portion does not overlap the first wall portion when viewed from the first direction,
the third wall portion is on a second side which is a side opposite to the first side, with respect to the board in the first direction, the third wall portion faces the first region, and the third wall portion does not overlap the fourth wall portion when view from the first direction,
the fourth wall portion is on the second side with respect to the board in the first direction, the fourth wall portion faces the second region, and the fourth wall portion does not overlap the third wall portion when view from the first direction,
the first wall portion and the second wall portion are separatable from each other, and
the third wall portion and the fourth wall portion are separatable from each other.

2. The semiconductor storage device according to claim 1, wherein
the housing includes a first part having a lower thermal conductivity than the first wall portion between the first wall portion and the second wall portion in a second direction from the first wall portion to the second wall portion.

3. The semiconductor storage device according to claim 1, wherein
the second wall portion is spaced away from the first wall portion in a second direction from the first wall portion to the second wall portion.

4. The semiconductor storage device according to claim 3, wherein
a longitudinal direction of a gap between the first wall portion and the second wall portion is along a third direction that intersects with the first direction and the second direction.

5. The semiconductor storage device according to claim 2, wherein
the housing includes a second part having a lower thermal conductivity than the third wall portion between the third wall portion and the fourth wall portion in the second direction.

6. The semiconductor storage device according to claim 2, wherein
the fourth wall portion is spaced away from the third wall portion in the second direction.

7. The semiconductor storage device according to claim 1, wherein
the housing includes a first single-piece member, and the first single-piece member includes the first wall portion and the fourth wall portion.

8. The semiconductor storage device according to claim 7, wherein
the housing includes a second single-piece member, and the second single-piece member includes the second wall portion and the third wall portion.

9. The semiconductor storage device according to claim 8, wherein
the first single-piece member includes a first coupling portion and a second coupling portion that are separated from each other in a third direction which intersects with the first direction and intersects with a second direction from the first wall portion to the second wall portion,
each of the first coupling portion and the second coupling portion couple the first wall portion to the fourth wall portion,
the second single-piece member includes a third coupling portion and a fourth coupling portion that are separated from each other in the third direction, and each of the third coupling portion and the fourth coupling portion couple the second wall portion to the third wall portion.

10. The semiconductor storage device according to claim 9, wherein
the first coupling portion and the second coupling portion are a fifth wall portion and a sixth wall portion, respectively, and
the fifth wall portion and the sixth wall portion are exposed to an outside of the housing.

11. The semiconductor storage device according to claim 10, wherein
a thickness of the fifth wall portion in the third direction is less than a thickness of the first wall portion in the first direction.

12. The semiconductor storage device according to claim 10, wherein
a length of the third coupling portion in the second direction is less than a length of the fifth wall portion in the second direction.

13. The semiconductor storage device according to claim 10, wherein
a thickness of the third coupling portion in the third direction is less than a thickness of the second wall portion in the first direction.

14. The semiconductor storage device according to claim 10, wherein
the housing includes a gap that is between the second single-piece member and the fifth wall portion in the third direction and is exposed to an outside of the housing.

15. The semiconductor storage device according to claim 10, wherein
both of the third coupling portion and the fourth coupling portion are between the fifth wall portion and the sixth wall portion in the third direction.

16. The semiconductor storage device according to claim 15, wherein
the second single-piece member is pivotable with respect to the first single-piece member.

17. The semiconductor storage device according to claim 1, wherein
the housing includes a first end and a second end on a side opposite to the first end in a second direction from the first wall portion to the second wall portion,
a first boundary portion is between the first wall portion and the second wall portion in the second direction,
a distance between the first boundary portion and the first end is longer than a distance between the first boundary portion and a center of the housing in the second direction,
a distance between the first boundary portion and the second end is longer than the distance between the first boundary portion and the center of the housing in the second direction,
a second boundary portion is between the third wall portion and the fourth wall portion in the second direction,
a distance between the second boundary portion and the first end is longer than a distance between the second boundary portion and the center of the housing in the second direction, and
a distance between the second boundary portion and the second end is longer than the distance between the second boundary portion and the center of the housing in the second direction.

18. The semiconductor storage device according to claim 1, further comprising:
an electronic component on the board, wherein an inner surface of the housing includes a recess that avoids the electronic component, and
the recess is across the first wall portion and the second wall portion or is across the third wall portion and the fourth wall portion.

19. The semiconductor storage device according to claim 1, wherein
the first wall portion includes a first support portion that protrudes in a direction from the first wall portion toward the third wall portion,
the second wall portion includes a second support portion that protrudes in a direction from the second wall portion toward the fourth wall portion,
the third wall portion includes a third support portion that protrudes in a direction from the third wall portion toward the first wall portion,
the fourth wall portion includes a fourth support portion that protrudes in a direction from the fourth wall portion toward the second wall portion, and
the board is fixed between the first support portion and the third support portion and is fixed between the second support portion and the fourth support portion.

20. The semiconductor storage device according to claim 19, further comprising:
a fixing member, wherein
the board includes an insertion hole, and
the fixing member passes through the first support portion, the insertion hole, and the third support portion.

* * * * *